s008625074B2

United States Patent
Matsumoto

(10) Patent No.: US 8,625,074 B2
(45) Date of Patent: Jan. 7, 2014

(54) EXPOSURE APPARATUS AND DEVICE FABRICATION METHOD

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 646 days.

(21) Appl. No.: 12/577,336

(22) Filed: Oct. 12, 2009

(65) Prior Publication Data

US 2010/0092882 A1   Apr. 15, 2010

(30) Foreign Application Priority Data

Oct. 14, 2008 (JP) .................................. 2008-265711

(51) Int. Cl.
- *G03B 27/52* (2006.01)
- *G01B 11/14* (2006.01)
- *G03F 9/00* (2006.01)

(52) U.S. Cl.
CPC ............ *G03F 9/7023* (2013.01); *G03F 9/7026* (2013.01); *G03F 9/7076* (2013.01)
USPC .............................. 355/55; 356/624; 356/620

(58) Field of Classification Search
CPC .... G03F 9/7023; G03F 9/7026; G03F 9/7076
USPC ............ 355/53, 55, 67, 72, 75; 356/399–401, 356/624, 620; 250/548; 430/30
See application file for complete search history.

(56) References Cited

U.S. PATENT DOCUMENTS

| | | | |
|---|---|---|---|
| 4,362,389 A * | 12/1982 | Koizumi et al. ............... 356/401 |
| 4,704,020 A | 11/1987 | Murakami | |
| 4,906,852 A * | 3/1990 | Nakata et al. ................. 250/548 |
| 4,952,970 A | 8/1990 | Suzuki | |
| 5,241,188 A | 8/1993 | Mizutani | |
| 5,424,552 A * | 6/1995 | Tsuji et al. ..................... 250/548 |
| 5,936,711 A * | 8/1999 | Miyai et al. ..................... 355/55 |
| 6,151,102 A * | 11/2000 | Nishi .............................. 355/53 |
| 6,278,514 B1 * | 8/2001 | Ohsaki ............................ 355/55 |
| 6,674,511 B2 | 1/2004 | Nomura | |
| 7,154,582 B2 | 12/2006 | Ohsaki | |
| 2002/0041377 A1* | 4/2002 | Hagiwara et al. ............. 356/399 |

FOREIGN PATENT DOCUMENTS

| | | |
|---|---|---|
| JP | 62-058624 A | 3/1987 |
| JP | 04-348019 A | 12/1992 |
| JP | 06-324472 A | 11/1994 |
| JP | 63-220521 A | 9/1998 |
| JP | 10-284370 A | 10/1998 |
| JP | 2000-012452 A | 1/2000 |
| JP | 2002-055435 A | 2/2002 |
| JP | 2004-266273 A | 9/2004 |
| JP | 2005-311198 A | 11/2005 |

* cited by examiner

*Primary Examiner* — Steven H Whitesell Gordon
(74) *Attorney, Agent, or Firm* — Canon U.S.A., Inc., IP Division

(57) ABSTRACT

The present invention provides an exposure apparatus including a projection optical system configured to project a pattern of a reticle located on an object plane onto a substrate located on an image plane, a phase shift type mark mounted on a stage which holds the substrate, an image sensor which is set at one of a position of the object plane and a position optically conjugate to the object plane, and is configured to capture an image of the mark via the projection optical system, and a controller configured to control the stage based on an interval between edge images, formed by a pair of edge portions, in the image of the mark captured by the image sensor.

10 Claims, 19 Drawing Sheets

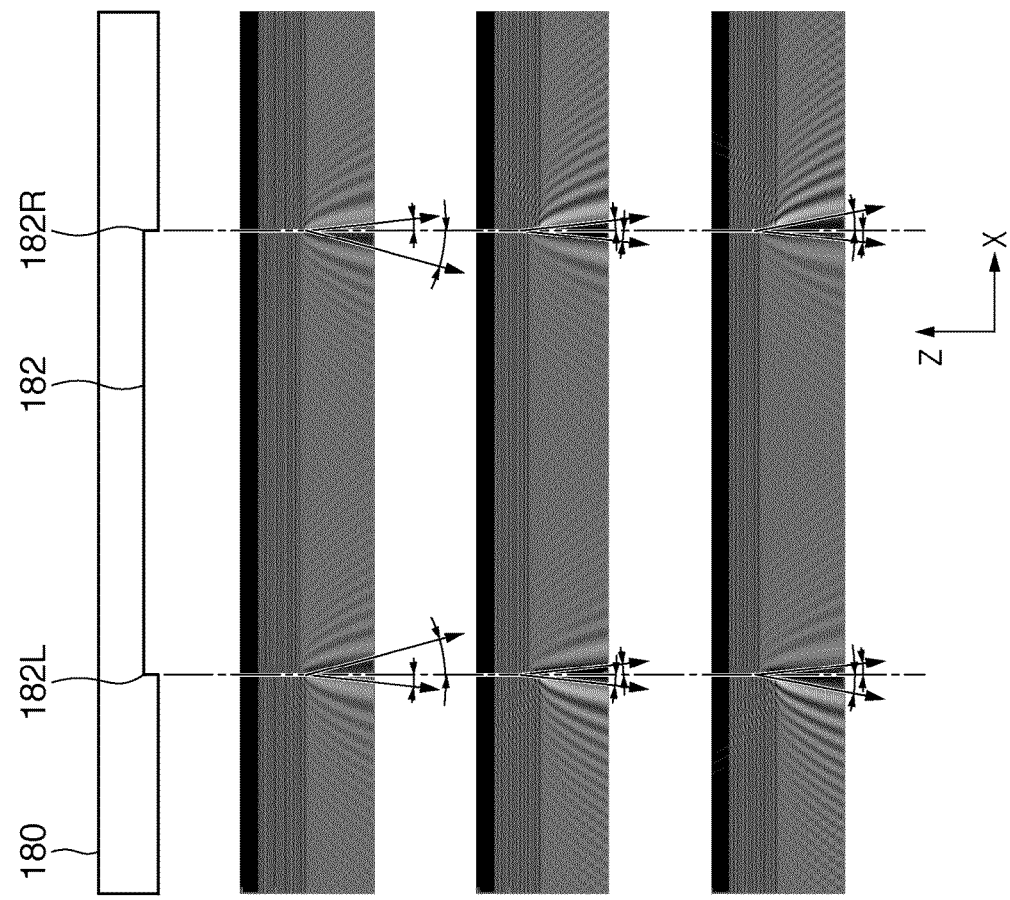

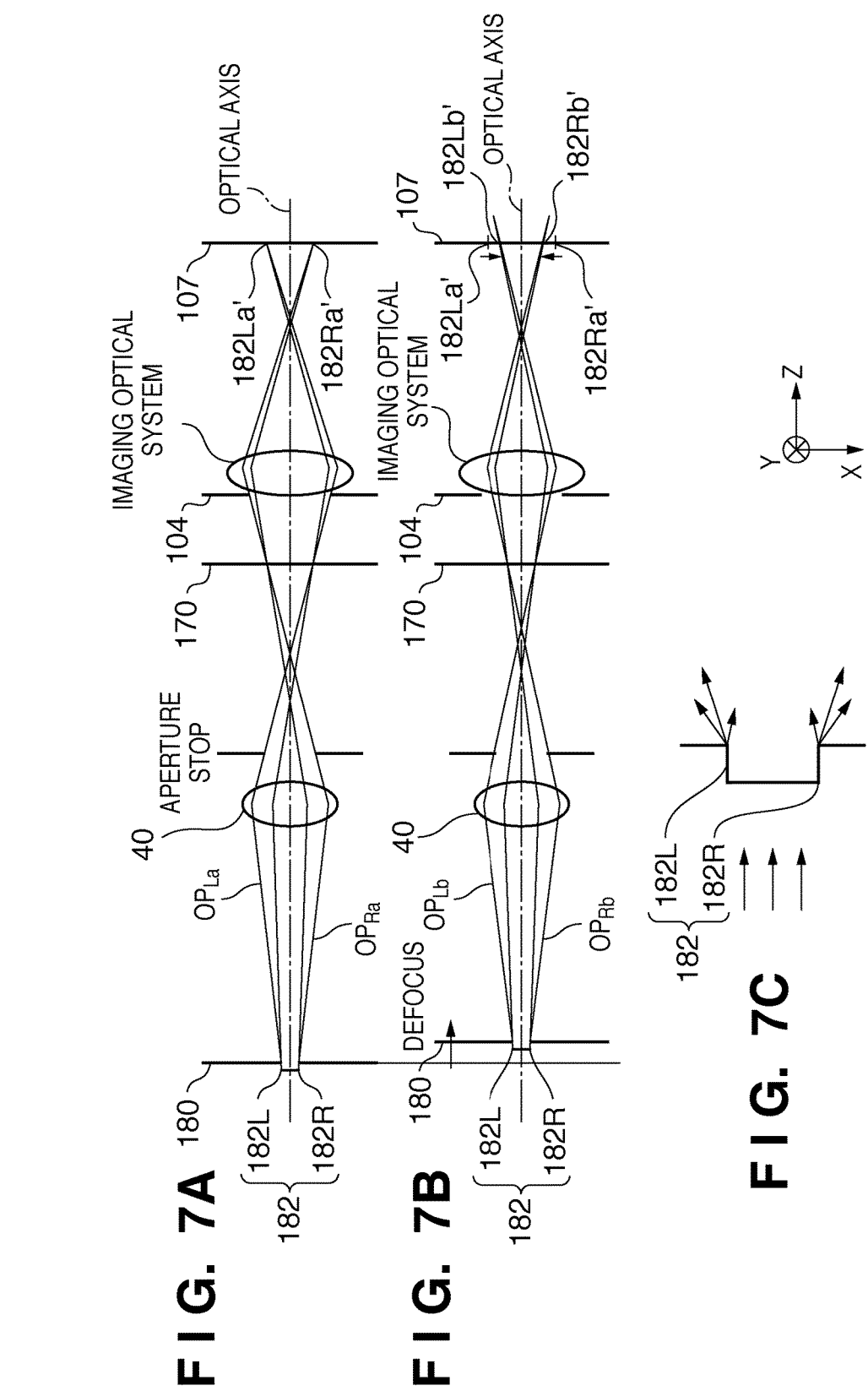

FIG. 13A
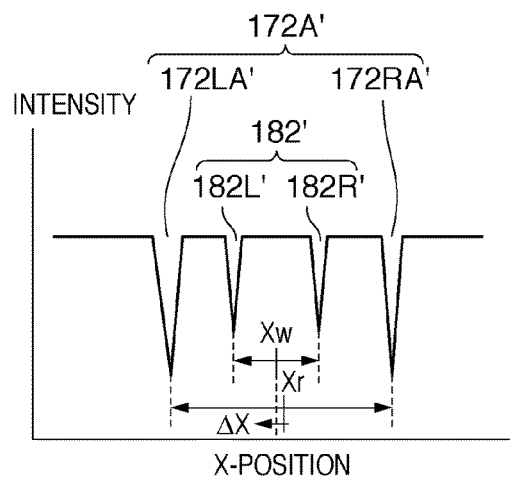
FIG. 13B
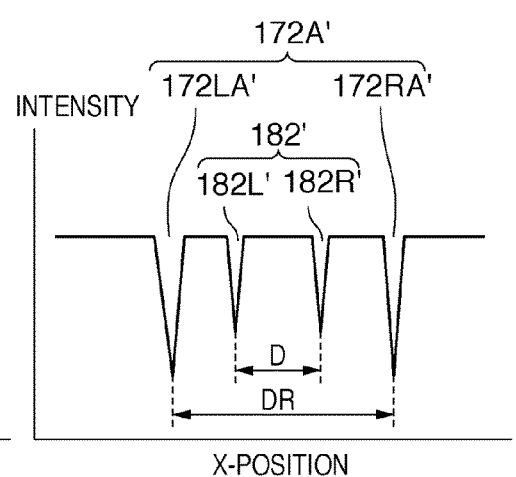
FIG. 14A
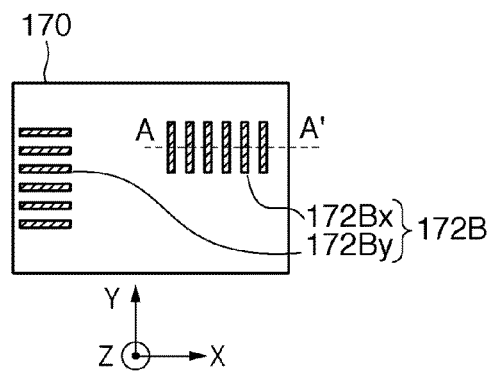
FIG. 14B
FIG. 14C
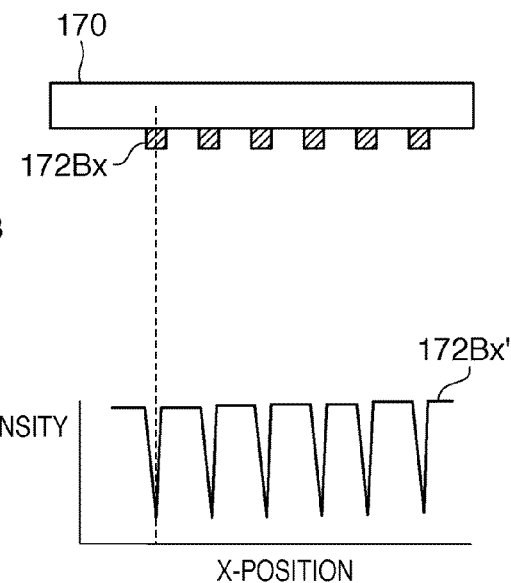

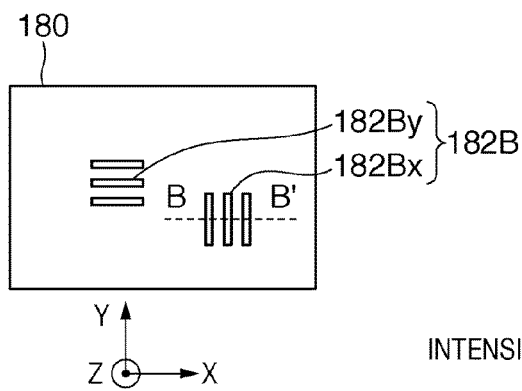
FIG. 15A
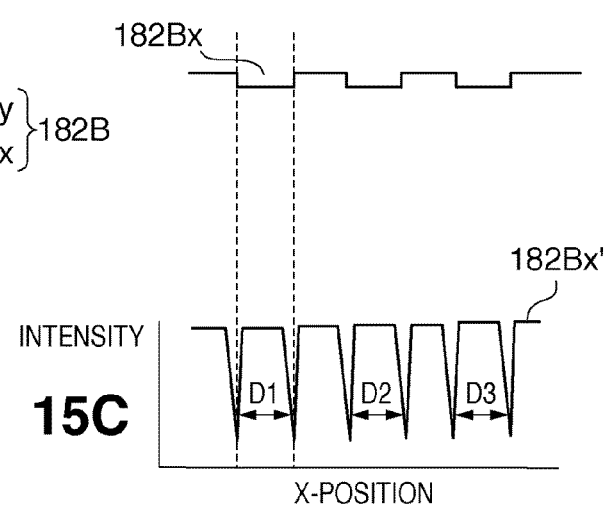
FIG. 15B
FIG. 15C
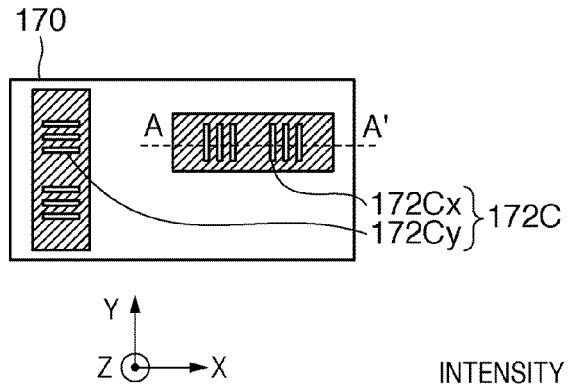
FIG. 16A
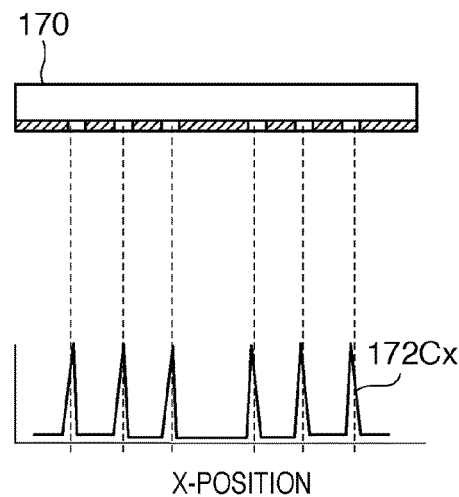
FIG. 16B
FIG. 16C FIG. 17A
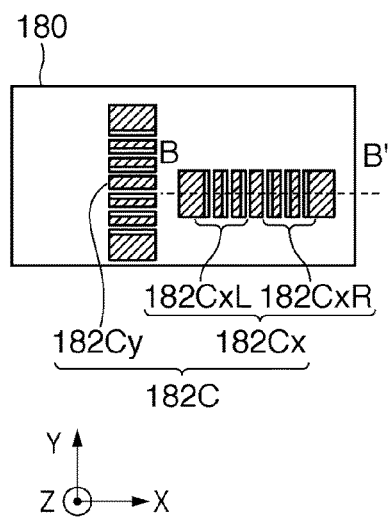
FIG. 17B
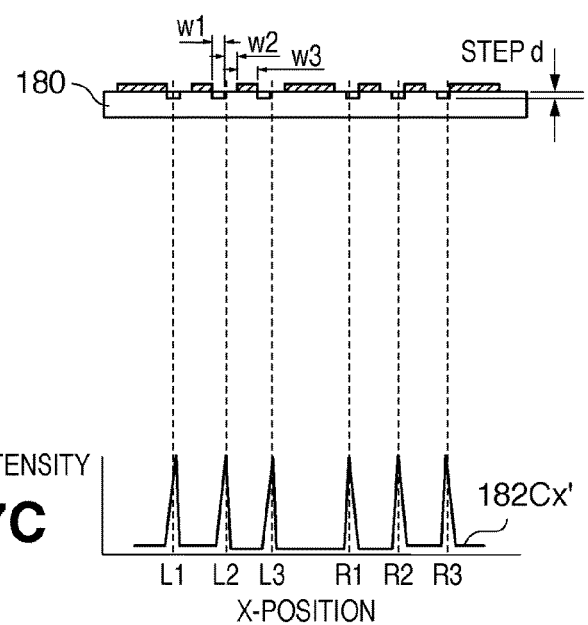
FIG. 17C

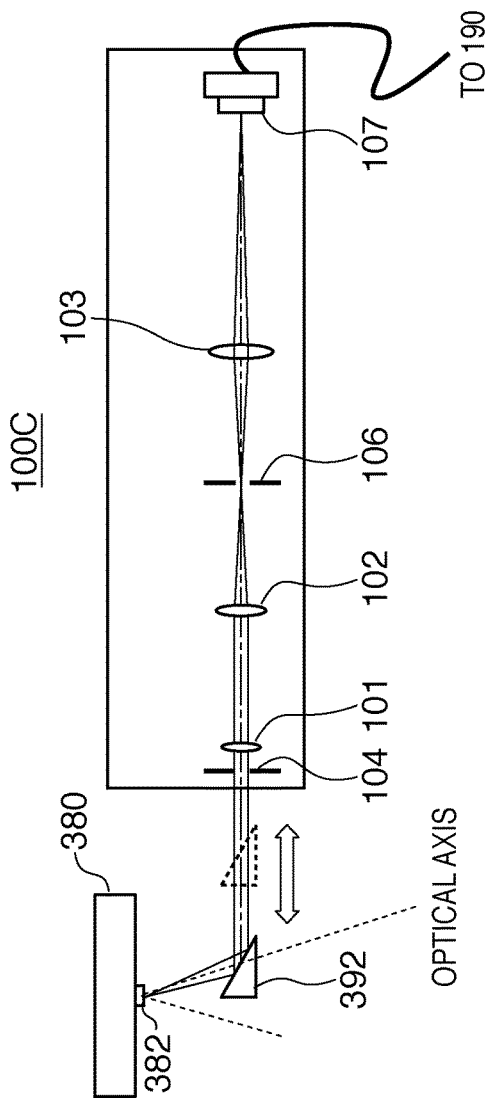
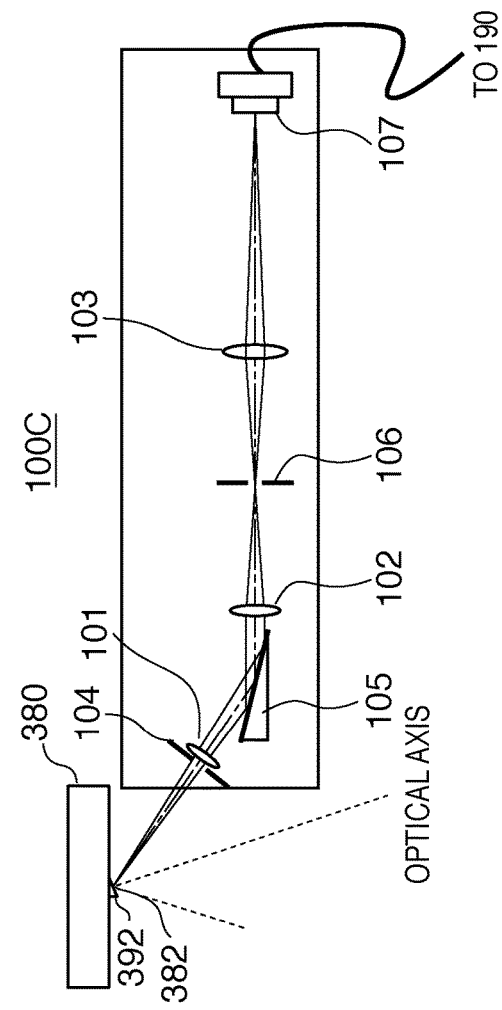
FIG. 25A
FIG. 25B

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus has been conventionally employed to fabricate micropatterned semiconductor devices such as a semiconductor memory and a logic circuit using photolithography. The projection exposure apparatus projects and transfers a pattern (circuit pattern) formed on a reticle (mask) onto a substrate such as a wafer using a projection optical system.

To keep up with advances in micropatterning (an increase in packing density) of semiconductor devices, the projection exposure apparatus is required to transfer the pattern of a reticle onto a wafer with a higher resolution. A minimum feature size (resolution) that the projection exposure apparatus can transfer is proportional to the wavelength of light for use in exposure (exposure light) and is inversely proportional to the numerical aperture (NA) of the projection optical system. According to this principle, the shorter the wavelength of the exposure light, the better the resolution. In view of this, currently, a KrF excimer laser beam (wavelength: about 248 nm) or an ArF excimer laser beam (wavelength: about 193 nm) is being used as the exposure light. At the same time, the practical application of an $F_2$ laser beam (wavelength: about 197 nm) and extreme ultraviolet (EUV) light is in progress.

The projection exposure apparatus is also required to expose a wider exposure region. To meet this requirement, an exposure apparatus (scanner) which relatively scans a reticle and a wafer to expose a rectangular slit-like exposure region has become the current mainstream in place of an exposure apparatus (stepper) which reduces and projects a nearly square-shaped exposure region on a reticle onto a wafer and performs full-plate exposure of the wafer.

Exposure using such an exposure apparatus requires alignment between a reticle and a wafer, so the exposure apparatus includes a plurality of alignment optical systems. The alignment optical systems include, for example, an off-axis alignment optical system and TTL (Through The Lens) alignment optical system. The off-axis alignment optical system detects an alignment mark on a wafer without a projection optical system. The TTL alignment optical system is also called a TTR (Through The Reticle) optical system, and detects the position of an alignment mark on a wafer relative to that of an alignment mark on a reticle via a projection optical system.

Also, the exposure apparatus includes an oblique-incidence focus-leveling detection system as a wafer surface position detection unit. The focus-leveling detection system obliquely irradiates with light a wafer surface onto which the pattern of a reticle is to be transferred (or a reference plate surface on a wafer stage), and detects the light obliquely reflected by the wafer surface (or the reference plate surface). In the focus-leveling detection system, an image sensor which senses the light reflected by the wafer surface (or the reference plate surface) is located such that the image sensor (image sensing surface) is nearly conjugate to the reflection point of the reflected light. With this arrangement, a positional shift (defocus) of the wafer (or the reference plate) in the optical axis direction of the projection optical system is measured as that on the image sensor of the focus-leveling detection system.

When the projection optical system absorbs exposure heat or its surrounding environment changes, an error naturally occurs between the measurement origin of the focus-leveling detection system and the focal plane of the projection optical system. To combat this situation, the TTL alignment optical system also has a function of measuring such an error (focus calibration).

Alignment detection and focus detection using a TTL alignment optical system will be explained with reference to FIGS. 26 and 27.

As shown in FIG. 26, a reticle 1100 is located on the object plane side of a projection optical system 1200. A TTL alignment optical system 1300 is located to allow observation of a wafer stage 1400 (i.e., a reference plate 1500 mounted on the wafer stage 1400) through an opening 1110 in the reticle 1100. The reference plate 1500 has a grid pattern 1510 formed in it. The opening 1110 in the reticle 1100 also has a grid pattern 1112 formed in it. Also, the TTL alignment optical system 1300 includes an illumination fiber 1310, field stop 1320, half mirror 1330, imaging lens 1340, and image sensor 1350.

After the reference plate 1500 is positioned at a predetermined position, the TTL alignment optical system 1300 captures the grid pattern 1510 in the reference plate 1500 and the grid pattern 1112 in the opening 1110 in the reticle 1100 side by side, as shown in FIG. 27. Subsequently, the amount of relative shift between the grid patterns 1510 and 1112 shown in FIG. 27 in their longitudinal direction is measured, thereby performing alignment detection between the reference plate 1500 and the reticle 1100.

Focus detection between the reference plate 1500 and the reticle 1100 is done as follows.

First, the grid pattern 1112 in the opening 1110 in the reticle 1100 is captured by the image sensor 1350. The position of the reticle 1100 in the optical axis direction of the imaging lens 1340 is adjusted so as to optimize the contrast of the waveform of the captured image sensing signal. With this operation, focusing between the reticle 1100 and the image sensor 1350 (its image sensing surface) is performed.

Likewise, the grid pattern 1510 in the reference plate 1500 is captured by the image sensor 1350, and the reference plate 1500 is moved in the optical axis direction to a position based on the capturing result, thereby performing focusing between the reference plate 1500 and the image sensor 1350. With this operation, focusing among the reticle 1100, the reference plate 1500, and the image sensor 1350 (its image sensing surface) is performed.

Japanese Patent Laid-Open Nos. 62-058624, 63-220521, 04-348019, 06-324472, and 2004-266273 disclose techniques associated with the foregoing alignment detection and focus detection using a TTL alignment optical system. In addition, Japanese Patent Laid-Open No. 2002-055435 discloses a technique of focus detection by transferring an asymmetrical grid pattern on a reticle onto a wafer, and measuring the position of the formed resist pattern, instead of using a TTL alignment optical system.

In recent years, as, for example, the wavelength of the exposure light shortens, and the NA of the projection optical system increases, the depth of focus decreases extremely. Along with this trend, accuracy of aligning a wafer surface to be exposed with a best imaging plane (so-called focus accuracy) increasingly becomes stricter. Furthermore, as micropatterning of semiconductor devices advances, overlay accuracy becomes more stringent as well. Under the circumstances, to maintain a given apparatus performance, it is becoming necessary to increase the frequencies of focus and alignment calibrations. Note that the fabrication of semiconductor devices must be stopped during these calibrations. In this respect, shortening the calibration time leads to a reduction in cost (an improvement in throughput) of semiconductor devices.

Unfortunately, the techniques disclosed in Japanese Patent Laid-Open Nos. 62-058624, 04-348019, and 06-324472 obtain a position at which the waveform contrast or the light amount is maximum by scanning the wafer stage in the optical axis direction of the projection optical system, so it takes a long time to scan the wafer stage. In addition, the technique disclosed in Japanese Patent Laid-Open No. 63-220521 obviates the need to scan the wafer stage by using a decentered stop but cannot perform alignment detection concurrently with focus detection, resulting in a decrease in throughput. Japanese Patent Laid-Open No. 2004-266273 discloses alignment detection but does not disclose focus detection.

The technique disclosed in Japanese Patent Laid-Open No. 2002-055435 can detect a best focus position with high accuracy but requires the formation of a resist pattern on a wafer. Thus, this technique is inferior in throughput to the other techniques using a TTL alignment optical system.

A TTL alignment optical system in an exposure apparatus (EUV exposure apparatus) which uses EUV light as the exposure light poses problems unique to the EUV exposure apparatus. For example, first, the EUV exposure apparatus uses a reflective reticle and therefore cannot use a conventional TTL alignment optical system. Second, the EUV exposure apparatus uses multilayer film mirrors and therefore suffers from a shortage of light attributed to a low light reflectance in case of the so-called double-pass detection scheme in which the test light reciprocates a projection optical system.

SUMMARY OF THE INVENTION

The present invention provides an exposure apparatus advantageous to shorten the time taken for focus detection.

According to one aspect of the present invention, there is provided an exposure apparatus including a projection optical system configured to project a pattern of a reticle located on an object plane onto a substrate located on an image plane, a phase shift type mark mounted on a stage which holds the substrate, an image sensor which is set at one of a position of the object plane and a position optically conjugate to the object plane, and is configured to capture an image of the mark via the projection optical system, and a controller configured to control the stage based on an interval between edge images, formed by a pair of edge portions of the mark, in the image of the mark captured by the image sensor.

Further features of the present invention will become apparent from the following description of exemplary embodiments with reference to the attached drawings.

BRIEF DESCRIPTION OF THE DRAWINGS

FIGS. 5A to 5D are views showing the results of simulating the light distribution characteristics by changing the step (i.e., the phase shift amount) of a step structure which forms the image plane side mark in the exposure apparatus shown in FIG. 1.

FIGS. 7A to 7C are views for explaining the imaging state of an image plane side mark of the phase shift type.

FIGS. 13A and 13B are graphs for explaining details of focus detection and alignment detection.

FIGS. 14A to 14C are views illustrating still another example of the arrangement of an object plane side mark in the exposure apparatus shown in FIG. 1.

FIGS. 15A to 15C are views illustrating another example of the arrangement of an image plane side mark in the exposure apparatus shown in FIG. 1.

FIGS. 16A to 16C are views illustrating still another example of the arrangement of an object plane side mark in the exposure apparatus shown in FIG. 1.

FIGS. 17A to 17C are views illustrating still another example of the arrangement of an image plane side mark in the exposure apparatus shown in FIG. 1.

FIGS. 25A and 25B are views for explaining guidance of a light beam from the grid pattern of the object plane side mark to the TTL alignment optical system.

DESCRIPTION OF THE EMBODIMENTS

Figure 1:
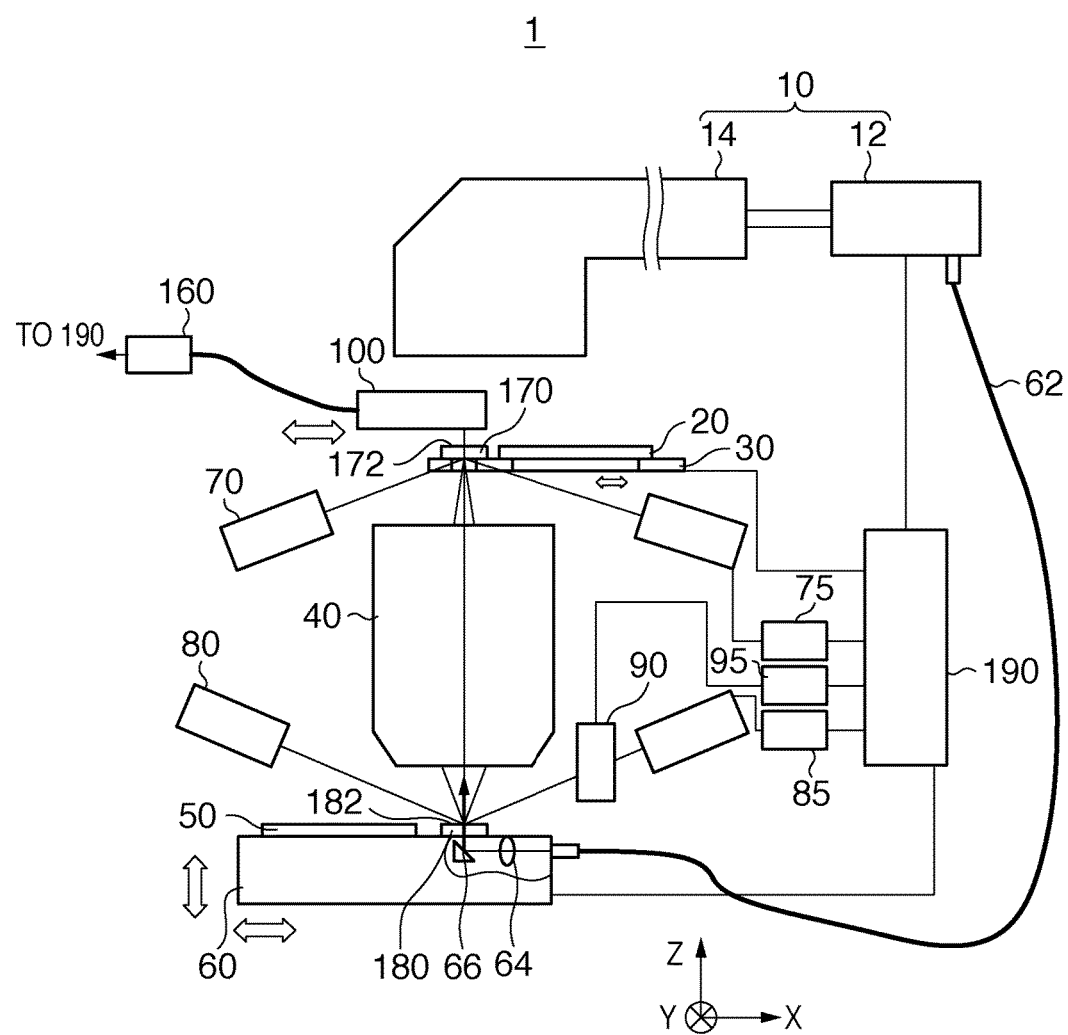
FIG. 1 is a view showing the arrangement of an exposure apparatus according to a first embodiment of the present invention.

Preferred embodiments of the present invention will be described below with reference to the accompanying drawings. Note that the same reference numerals denote the same members throughout the drawings, and a repetitive description thereof will not be given.

FIG. 1 is a view showing the arrangement of an exposure apparatus 1 according to a first embodiment of the present invention. In this embodiment, the exposure apparatus 1 is a projection exposure apparatus (scanner) which transfers the pattern of a reticle 20 onto a wafer 50 by the step & scan scheme. However, the exposure apparatus 1 can also adopt the step & repeat scheme or another exposure scheme.

As shown in FIG. 1, the exposure apparatus 1 includes an illumination apparatus 10, a reticle stage 30 which holds the reticle 20 and a reference plate 170, a projection optical system 40, and a wafer stage 60 which holds the wafer 50 and a reference plate 180. The exposure apparatus 1 also includes a reticle surface position detection system 70, calculation unit 75, wafer surface position detection system 80, calculation unit 85, off-axis alignment optical system 90, and calculation unit 95. The exposure apparatus 1 also includes a TTL alignment optical system 100, calculation unit 160, and main control unit 190.

The illumination apparatus 10 illuminates the reticle 20 on which a pattern to be transferred is formed, and includes a light source 12 and illumination optical system 14.

The light source 12 uses, for example, a laser beam such as an ArF excimer laser beam having a wavelength of about 193 nm or a KrF excimer laser beam having a wavelength of about 248 nm.

The illumination optical system 14 illuminates an illumination target surface with a light beam from the light source 12. The illumination optical system 14 includes a lens, mirror, optical integrator, and stop. In this embodiment, the illumination optical system 14 shapes a light beam into a shape optimum for exposure and illuminates the reticle 20 with the light beam.

The reticle 20 has a circuit pattern and is supported and driven by the reticle stage 30. Diffracted light generated by the reticle 20 is projected onto the wafer 50 via the projection optical system 40. The reticle 20 and the wafer 50 are located in an optically conjugate relationship. Since the exposure apparatus 1 is a scanner, it transfers the pattern of the reticle 20 onto the wafer 50 by scanning them at a speed ratio equal to the reduction magnification. Note that the reticle 20 is set at a predetermined position by detecting the position of the reticle 20 by the reticle surface position detection system 70 and the calculation unit 75.

The reticle stage 30 supports the reticle 20 and reference plate 170. The reticle stage 30 moves the reticle 20 and reference plate 170 in the X-, Y-, and Z-axis directions and the rotation directions about the respective axes using, for example, a linear motor.

The projection optical system 40 has a function of forming an image of the light from the object plane on the image plane. In this embodiment, the projection optical system 40 has a reduction magnification of ¼ and forms an image of the light diffracted by the pattern of the reticle 20 on the wafer 50. The projection optical system 40 can be, for example, a dioptric system, a catadioptric system, or a catoptric system.

The wafer 50 is a substrate which is coated with a resist (photosensitive agent) and onto which the pattern of the reticle 20 is projected (transferred). The wafer 50 is also a test object the position of which is detected by the wafer surface position detection system 80 and off-axis alignment optical system 90. It is also possible to substitute the wafer 50 by a glass plate or another substrate.

The wafer stage 60 supports the wafer 50 and reference plate 180. The wafer stage 60 moves the wafer 50 and reference plate 180 in the X-, Y-, and Z-axis directions and the rotation directions about the respective axes using, for example, a linear motor, as in the reticle stage 30.

Also, the wafer stage 60 is connected to an optical fiber 62. The optical fiber 62 serves to partially guide a light beam from the light source 12 to the wafer stage 60. A lens 64 and deflecting mirror 66 are located on the wafer stage 60. The lens 64 serves to guide the light beam emerging from the optical fiber 62. The deflecting mirror 66 serves to guide the light beam having passed through the lens 64 to the reference plate 180.

A laser interferometer, for example, monitors the positions of the reticle stage 30 and wafer stage 60, which are driven at a predetermined speed ratio.

The reticle surface position detection system 70 includes an oblique-incidence optical system. The reticle surface position detection system 70 obliquely irradiates the reticle 20 with light, and detects the light obliquely reflected by the reticle 20.

The calculation unit 75 calculates the position of the reticle 20 in the Z-axis direction (the optical axis direction of the projection optical system 40) based on the detection result obtained by the reticle surface position detection system 70.

The wafer surface position detection system 80 obliquely irradiates the wafer 50 with light, and detects the light obliquely reflected by the wafer 50, as in the reticle surface position detection system 70.

The calculation unit 85 calculates the position of the wafer 50 in the Z-axis direction (the optical axis direction of the projection optical system 40) based on the detection result obtained by the wafer surface position detection system 80.

The off-axis alignment optical system 90 and calculation unit 95 cooperatively perform alignment detection of the wafer 50.

The TTL alignment optical system 100 and calculation unit 160 cooperatively detect the relative positional relationship between an object plane side mark 172 formed on the reference plate 170 and an image plane side mark 182 formed on the reference plate 180. The TTL alignment optical system 100 and calculation unit 160 can also detect the relative positional relationship between the reticle 20 and the reference plate 180 on the wafer stage 60 by moving the reticle stage 30.

The main control unit 190 includes a CPU and memory and is electrically connected to the illumination apparatus 10, reticle stage 30, and wafer stage 60. The main control unit 190 is also electrically connected to the calculation units 75, 85, 95, and 160. The main control unit 190 controls the operation of the exposure apparatus 1 through each unit mentioned above. In this embodiment, the main control unit 190 controls operations (including, for example, calculation processes) associated with alignment detection (position detection in a direction perpendicular to the optical axis of the projection optical system 40) and focus detection (position detection in the optical axis direction of the projection optical system 40).

Alignment detection and focus detection using the TTL alignment optical system 100 may be implemented, for example, as follows.

Figure 2:
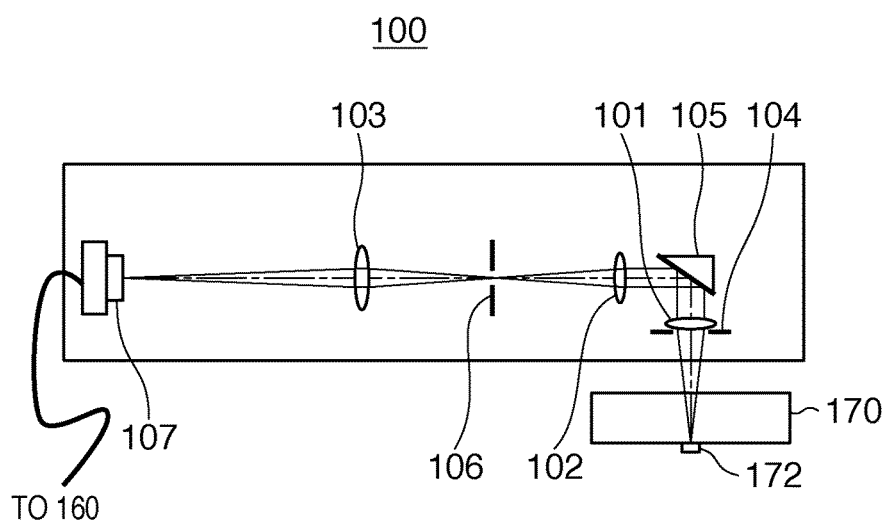
FIG. 2 is a view showing the arrangement of a TTL alignment optical system of the exposure apparatus shown in FIG. 1.

The TTL alignment optical system 100 includes imaging lenses (imaging optical system) 101, 102, and 103, an aperture stop 104, a reflecting mirror 105, a field stop 106, and an image sensor 107, as shown in FIG. 2. In this embodiment, the imaging lenses 101 and 102 have a unit imaging magnification, and the imaging lens 103 has an imaging magnification of 50×. FIG. 2 is a view showing the arrangement of the TTL alignment optical system 100.

The object plane side mark 172 for alignment, formed on the reference plate 170 on the reticle stage 30, is imaged on the field stop 106 via the imaging lenses 101 and 102. The object plane side mark 172 imaged on the field stop 106 is imaged again on the image sensor 107 via the imaging lens 103. The image of the object plane side mark 172 captured by the image sensor 107 is sent to the calculation unit 160.

In contrast, the image plane side mark 182 for alignment, formed on the reference plate 180 on the wafer stage 60, is illuminated from below with the light beam (a light beam having the same wavelength as that of the exposure light) emerging from the optical fiber 62. As described above, the lens 64 and deflecting mirror 66 are inserted between the optical fiber 62 and the reference plate 180, and the reference plate 180 is illuminated with light having a predetermined illumination shape and angular distribution. The light scattered (diffracted) by the image plane side mark 182 forms an image at the position of the reference plate 170 on the reticle stage 30 via the projection optical system 40 while being enlarged at a magnification of 4×. Consequently, the image plane side mark 182 on the reference plate 180 on the wafer side and the object plane side mark 172 on the reference plate 170 on the reticle side are imaged on the image sensor 107 of the TTL alignment optical system 100.

The object plane side mark 172 and image plane side mark 182 will be further explained in detail below.

Figure 3A:
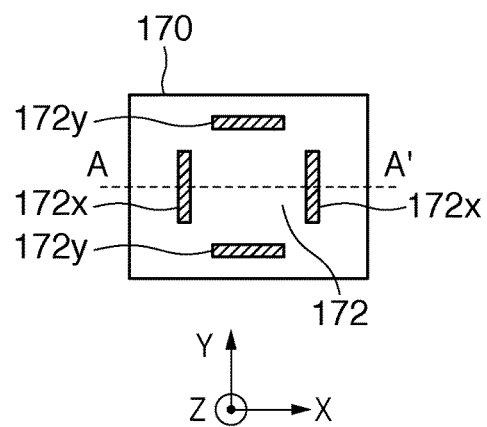
FIGS. 3A and 3B are views illustrating an example of the arrangement of an object plane side mark in the exposure apparatus shown in FIG. 1.
Figure 3B:
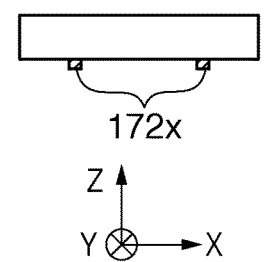

FIGS. 3A and 3B are views illustrating an example of the arrangement of the object plane side mark 172. FIG. 3A is a top view of the object plane side mark 172, and FIG. 3B is a sectional view of the object plane side mark 172 taken along a plane A-A'. The object plane side mark 172 is formed on the reference plate 170 formed from a transmission substrate (e.g., a glass substrate or a quartz substrate). The object plane side mark 172 is formed from a light-shielding film made of, for example, chromium or chromium oxide, and has a function of shielding the light beam from the optical fiber 62. In other words, the object plane side mark 172 is made of chromium or chromium oxide having a thickness (about 100 nm) large enough to sufficiently shield (absorb) a light beam. In this embodiment, the object plane side mark 172 includes a mark 172x including two rectangular patterns, and a mark 172y obtained by rotating the mark 172x through 90°.

The overall size of the object plane side mark 172 is determined in accordance with the reduction magnification of the projection optical system 40. In this embodiment, since the projection optical system 40 has a reduction magnification of ¼, the overall size of the object plane side mark 172 is reduced to ¼ so that the reduced object plane side mark 172 has an overall size about twice that of the image plane side mark 182.

Figure 4A:
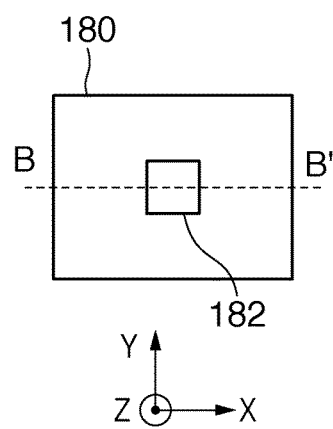
FIGS. 4A and 4B are views illustrating an example of the arrangement of an image plane side mark in the exposure apparatus shown in FIG. 1.
Figure 4B:
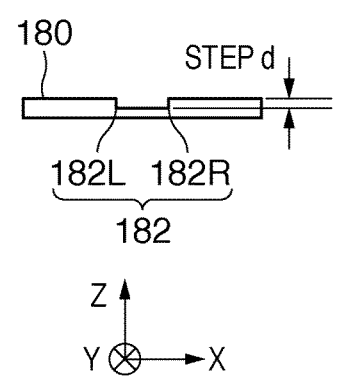

FIGS. 4A and 4B are views illustrating an example of the arrangement of the image plane side mark 182. FIG. 4A is a top view of the image plane side mark 182, and FIG. 4B is a sectional view of the image plane side mark 182 taken along a plane B-B'. The image plane side mark 182 is formed on the reference plate 180 formed from a transmission substrate (e.g., a glass substrate or a quartz substrate). The image plane side mark 182 is formed by etching the reference plate 180, and has a quadrangular step structure in this embodiment. In this manner, the image plane side mark 182 has a step structure formed from a so-called phase shift type mark without using a light-shielding film.

Let λ be the wavelength of the light beam from the optical fiber 62 (a light beam which illuminates the image plane side mark 182), n be the refractive index of the reference plate 180 (transmission substrate), and m be a natural number. Then, a step d of the step structure which forms the image plane side mark 182 satisfies:

$$d=(2m-1)\cdot\lambda/\{4(n-1)\} \quad (1)$$

From the foregoing, the phase shift amount (the phase difference between a light beam which passes through a relatively low region (first region) and that which passes through a relatively high region (second region) in the step structure) of a light beam which passes through the image plane side mark 182 in the step structure (edge portion) is an odd multiple of 90°. Note that equation (1) shows the step d of a most preferable step structure. For this reason, the phase shift amount does not need to be exactly an odd multiple of 90°. For example, it suffices if the phase shift amount is roughly an odd multiple of 90° with an error within a range of about ±20°.

The distribution characteristic of a light beam which passes through the image plane side mark 182 of the phase shift type will be explained with reference to FIGS. 5A to 5D. FIG. 5A is an enlarged sectional view of the image plane side mark 182. In FIG. 5A, reference numerals 182L and 182R respectively denote the left and right edge portions (a pair of edge portions) of the step structure. FIGS. 5B to 5D are views showing the results of simulating the light distribution characteristics by changing the step d (i.e., the phase shift amount) of the step structure which forms the image plane side mark 182. More specifically, FIG. 5B shows a case in which the phase shift amount (phase difference) is 90°, FIG. 5C shows a case in which the phase shift amount is 180°, and FIG. 5D shows a case in which the phase shift amount is 270°.

As shown in FIGS. 5B and 5D, image plane side marks 182 which implement phase shifts by amounts of 90° and 270° that are odd multiples of 90° generate light distributions in each of which the scattering characteristics near the edge portions of the step structure are asymmetrical about the Z-axis direction. Assume herein that the imaging optical system images an image plane side mark 182 which generates a light distribution asymmetrical about the Z-axis direction. In this case, as the image plane side mark 182 moves in the Z-axis direction, the centroid of the light intensity in the X-Y plane also moves. This is because the centroid of the light intensity at a position optically conjugate to the image plane moves.

In contrast, as shown in FIG. 5C, an image plane side mark 182 which implements a phase shift by an amount of 180° that largely deviates from an odd multiple of 90° generates a light distribution in which the scattering characteristics near the edge portions of the step structure are nearly symmetrical about the Z-axis direction. Assume herein that the imaging optical system images such an image plane side mark 182. In this case, even when the image plane side mark 182 moves in the Z-axis direction, the centroid of the light intensity in the X-Y plane moves by only a small amount, and therefore has a low sensitivity to movement in the Z-axis direction.

Figure 6A:
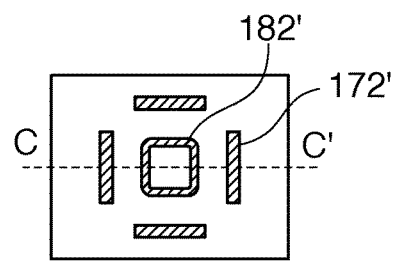
FIGS. 6A and 6B are views showing an object plane side mark image and image plane side mark image obtained by capturing the object plane side mark shown in FIGS. 3A and 3B and the image plane side mark shown in FIGS. 4A and 4B by an image sensor of the TTL alignment optical system.
Figure 6B:
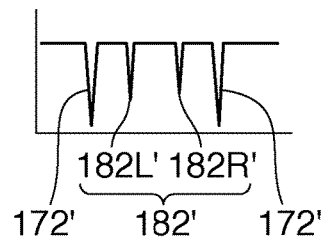

FIGS. 6A and 6B show an object plane side mark image 172' and image plane side mark image 182' obtained by capturing the object plane side mark 172 shown in FIGS. 3A and 3B and the image plane side mark 182 shown in FIGS. 4A and 4B by the image sensor 107 of the TTL alignment optical system 100. FIG. 6A is a top view of the object plane side mark image 172' and image plane side mark image 182' captured by the image sensor 107. FIG. 6B is a graph showing the light intensity distribution of the object plane side mark image 172' and image plane side mark image 182' in a plane C-C'.

The TTL alignment optical system 100 (image sensor 107) simultaneously captures both the object plane side mark image 172' and image plane side mark image 182'. Note that the image plane side mark image 182' is positioned on the inner side of the object plane side mark image 172'. As shown in FIG. 6B, a light beam which forms the object plane side mark image 172' is shielded by the object plane side mark 172 formed from a light-shielding film, and therefore has a decreased intensity due to this shielding. A light beam which forms the image plane side mark image 182' (edge images 182L' and 182R') has a decreased intensity due to factors associated with the edge portions 182L and 182R of the step structure which forms the image plane side mark 182. Note that a decrease in light intensity due to factors associated with the edge portions 182L and 182R of the step structure is accounted for by the influence of their light scattering and interference between the upper surface/lower surface at the edge portions.

The imaging state of the image plane side mark 182 of the phase shift type will be explained with reference to FIGS. 7A to 7C. As shown in FIGS. 7A to 7C, the light beam (scattered light) from the image plane side mark 182 on the reference plate 180 illuminated with the light beam from the optical fiber 62 enters the projection optical system 40 and forms an image on the reference plate 170. The light beam from the image plane side mark 182 forms an image again on the image sensor 107 via the imaging optical system including the imaging lenses 101 to 103.

As shown in FIG. 7C, the distributions of light beams scattered by the edge portions 182L and 182R of the step structure which forms the image plane side mark 182 are not isotropic but asymmetrical. More specifically, the distributions of light beams scattered by the edge portions 182L and 182R each have a light intensity that is higher in a direction away from the central portion of the image plane side mark 182 (step structure) and is lower in other directions. Moreover, because the edge portions 182L and 182R have a structure symmetrical about the optical axis, the distributions of light beams scattered by the edge portions 182L and 182R are bilaterally symmetrical about the central portion of the image plane side mark 182. In this manner, the image plane side mark 182 of the phase shift type is used to generate scattered light having asymmetrical light distributions in this embodiment. A displacement of the image plane side mark image 182' on the image sensor 107 is especially large when the phase shift amount (phase difference) is an odd multiple of 90°, as described above.

Referring to FIG. 7A, the light beams scattered by the edge portions 182L and 182R reach the image sensor 107 upon traveling along optical paths $OP_{La}$ and $OP_{Ra}$, and form edge images 182La' and 182Ra'.

A case in which the reference plate 180 defocuses, as shown in FIG. 7B, will be considered herein. In this case, the light beams scattered by the edge portions 182L and 182R reach the image sensor 107 upon traveling along optical paths $OP_{Lb}$ and $OP_{Rb}$, and form edge images 182Lb' and 182Rb'.

As the reference plate 180 defocuses, the edge images 182Lb' and 182Rb' deviate in the optical axis direction with respect to the edge images 182La' and 182Ra' that are in focus. Hence, the defocus state of the image plane side mark 182 (i.e., the reference plate 180) can be detected by measuring the interval between the edge image 182La' or 182Lb' and the edge image 182Ra' or 182Rb'. In other words, focus detection can be performed by this measurement.

The position of the image plane side mark 182 in the X-Y plane can be detected independently of focusing by measuring the middle position between the edge image 182La' or 182Lb' and the edge image 182Ra' or 182Rb'. In other words, alignment detection can be performed by this measurement.

Figure 8A:
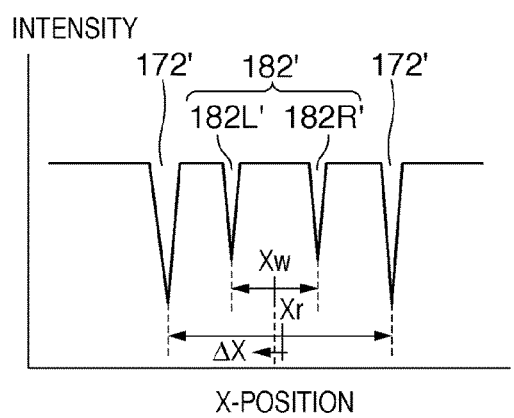
FIGS. 8A and 8B are graphs for explaining details of focus detection and alignment detection.
Figure 8B:
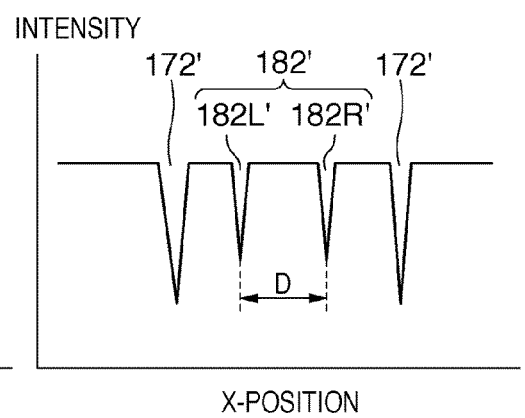

Focus detection and alignment detection in this embodiment will be explained in detail with reference to FIGS. 8A and 8B. FIGS. 8A and 8B are graphs showing the light intensity distributions (equivalent to that shown in FIG. 6B) of the object plane side mark image 172' and image plane side mark image 182' captured by the image sensor 107 of the TTL alignment optical system 100.

Alignment detection will be explained first. In FIG. 8A, a position Xr of the object plane side mark image 172' on the image sensor 107 is detected as the middle position (or the centroidal position) between images of the two rectangular marks which constitute the object plane side mark 172. On the other hand, a position Xw of the image plane side mark image 182' on the image sensor 107 is detected as the middle position between the edge images 182L' and 182R'.

From the foregoing, an amount of positional shift ΔX of the image plane side mark 182 relative to the object plane side mark 172 is given by:

$$\Delta X = (Xr - Xw)/(m1 \cdot m2) \qquad (2)$$

Where m1 is the imaging magnification at which the light from the image plane side of the projection optical system 40 forms an image (i.e., m1 is the reciprocal of the reduction magnification and is 4× in this embodiment), and m2 is the imaging magnification of the TTL alignment optical system 100.

Focus detection will be explained next. Focus detection is performed by measuring a distance (interval) D between the edge images 182L' and 182R', as shown in FIG. 8B.

A signal processing method known to those skilled in the art can be used to measure the positions of the mark images in alignment detection and to measure the interval between the mark images in focus detection. The signal processing method includes, for example, the centroid processing method, the template matching method, the bilateral symmetric processing method, a method of approximating a signal peak (or a bottom position) by a higher-order function, and a method of differentiating a signal and obtaining the target measurement value from a position at which the signal differential has a maximum slope.

The resolution of focus detection in this embodiment is further explained in detail next. In one concrete numerical example, the wavelength of the light beam from the optical fiber 62 is assumed to be 248 nm, the refractive index of the reference plate 180 is assumed to be 1.5, and the step of the step structure which forms the image plane side mark 182 is assumed to be 124 nm (equivalent to a phase difference of 90°). In addition, the imaging magnification at which the light from the image plane side of the projection optical system 40 forms an image is assumed to be 4×, and the imaging magnification of the TTL alignment optical system 100 is assumed to be 100×. The image sensor 107 of the TTL alignment optical system 100 is assumed to be a CCD, which has a pixel pitch of 5 μm. The numerical aperture (NA) of the projection optical system 40 on the image plane side is assumed to be 0.7, and the TTL alignment optical system 100 is assumed to have a numerical aperture (NA) high enough to trap all components of the light beam from the projection optical system 40. The light beam from the optical fiber 62 is assumed to have a coherence factor σ of 0.5 via the lens 64. The lens 64 is assumed to be able to illuminate a range wider than the size of an image obtained by inversely projecting the object plane side mark 172 onto the reference plate 180. The line width of the rectangular marks which form the object plane side mark 172 is assumed to be 1.2 μm.

Figure 9A:
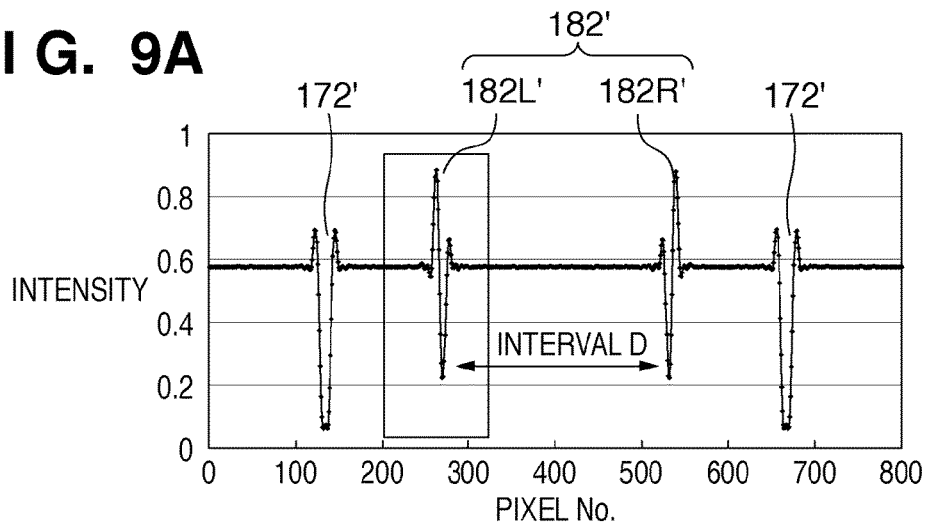
FIGS. 9A to 9C are graphs for explaining the resolution of focus detection.
Figure 9B:
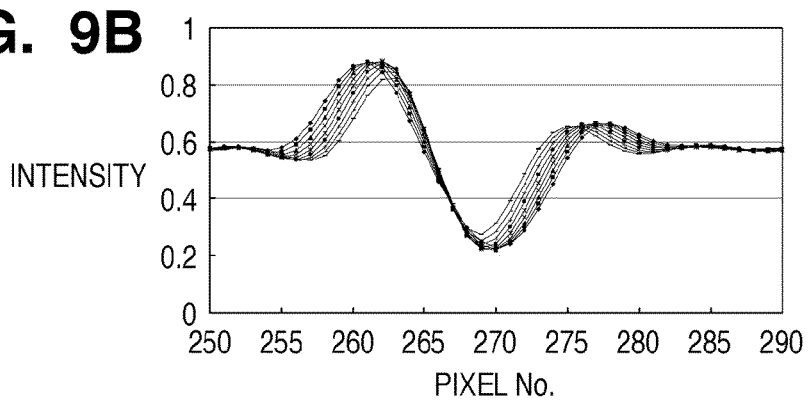
Figure 9C:
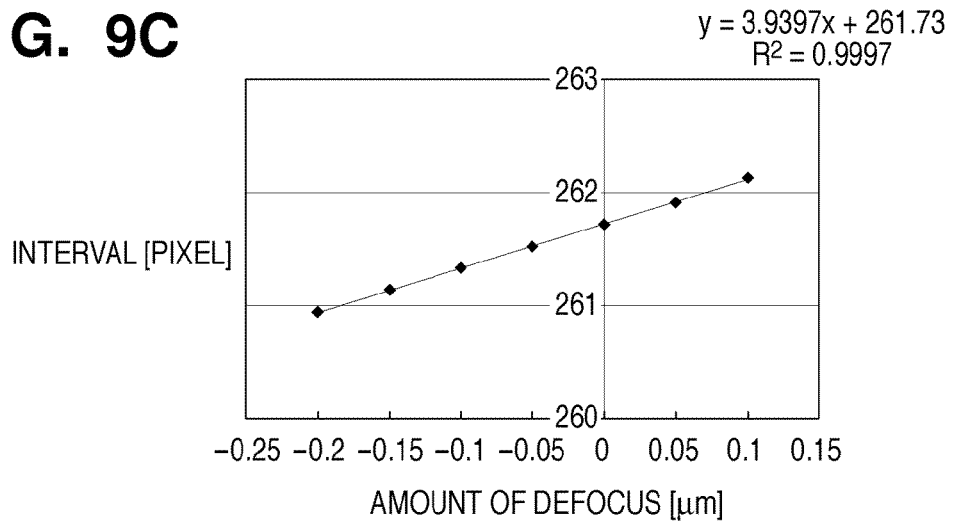

In the above-mentioned numerical example, FIG. 9A shows the signal waveform output from the image sensor 107, FIG. 9B shows a change in signal waveform due to defocusing, and FIG. 9C shows the focus dependence of the interval between the edge images 182L' and 182R'. FIG. 9A corresponds to the light intensity distribution of the object plane side mark image 172' and image plane side mark image 182'. FIG. 9A reveals that the image plane side mark image 182' is formed on the inner side of the object plane side mark image 172'.

FIG. 9B shows a change of the left edge image 182L' (a region surrounded by a quadrangle in FIG. 9A) of the image plane side mark image 182' shown in FIG. 9A. Referring to FIG. 9B, the bottom position of the light intensity of the image plane side mark image 182' has changed due to defocusing.

Also, the distance (bottom position) between bottoms generated in the two edge images 182L' and 182R' of the image plane side mark image 182' is calculated. A bottom position is calculated using a higher-order function approximation method as follows. First, a CCD pixel in which the light intensity is relative minimum is obtained. Quadratic function approximation is performed based on data of the light intensities in a total of 9 pixels: the obtained pixel and ±4 pixels in its vicinity. The relative minimum position of the approximation curve is calculated and determined as a bottom position. Bottom positions are calculated for the respective edge images, and their distance is determined as the interval D.

FIG. 9C shows the focus dependence of the interval D between the edge images 182L' and 182R'. As shown in FIG. 9C, the focus dependence of the interval D has excellent linearity, and a change in interval D per defocus of 1 μm is 3.94 pixels. Since the pixel resolution of a higher-order function approximation method is typically about 1/20 pixel, a resolution of about 1000/3.94/20=12.7 nm is obtained in focus detection. Using the interval D between the edge images 182L' and 182R', an amount of defocus Fz can be calculated by:

$$Fz=(D-D0)/m3 \quad (3)$$

Where D0 is the offset that is the intercept (261.73 in this embodiment) of the expression describing the focus dependence of the interval D shown in FIG. 9C; and m3 is the slope (3.9397 in this embodiment) of the expression describing the focus dependence of the interval D shown in FIG. 9C. m3 is acquired (i.e., a focus dependence as shown in FIG. 9C is acquired) during assembly of the exposure apparatus 1, and is saved in the exposure apparatus 1 as a system parameter. A focus dependence as shown in FIG. 9C is also acquired for D0. D0 is calculated by comparison with the standard value of exposure evaluation described in Japanese Patent Laid-Open No. 2002-055435, and is saved in the exposure apparatus 1 as a system parameter. Alternatively, a grid mark may be located near the image plane side mark 182 on the reference plate 180, a position at which the mark has a maximum contrast may be calculated, and the interval in this state may be determined as D0, as in Japanese Patent Laid-Open No. 63-220521.

In this manner, the amount of defocus Fz can be calculated in a short period of time by substituting m3, D0, and the interval D between the edge images 182L' and 182R', which are saved in the exposure apparatus 1 as system parameters, into equation (3).

Although the foregoing is concerned with alignment detection and focus detection in the X-axis direction, the same applies to those in the Y-axis direction.

A CCD (two-dimensional sensor) is used as the image sensor 107 of the TTL alignment optical system 100 in this embodiment. Alternatively, a line sensor may be used as the image sensor 107 of the TTL alignment optical system 100. In this case, a beam splitter is disposed to split the optical path into two, and line sensors having pixels arrayed in the respective directions of measurement are used.

Alignment detection and focus detection between the reference plate 170 and the reference plate 180 using the TTL alignment optical system 100 by forming the object plane side mark 172 on the reference plate 170 have been explained in this embodiment. However, the object plane side mark 172 need not always be formed on the reference plate 170, and may be formed on the reticle 20.

Figure 10:
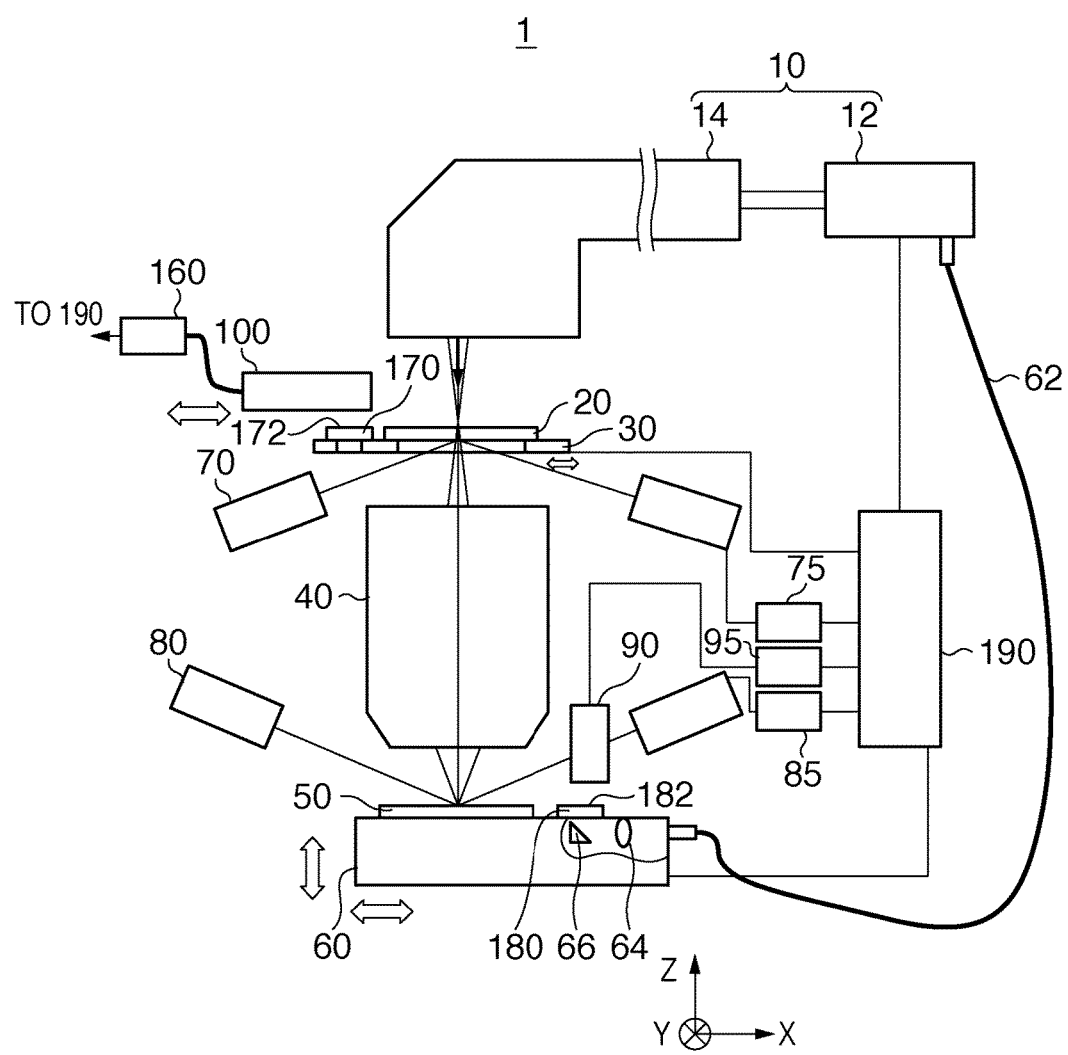
FIG. 10 is a view showing the arrangement of an exposure apparatus according to one aspect of the present invention.

After the exposure apparatus 1 completes alignment detection and focus detection using the TTL alignment optical system 100, it performs an exposure process. More specifically, as shown in FIG. 10, illumination of the reference plate 180 by the optical fiber 62 is stopped upon retracting the TTL alignment optical system 100 to a position at which it does not shield a light beam (exposure light) which illuminates the reticle 20. The wafer 50 is positioned at the imaging position of the projection optical system 40 by the wafer stage 60, and the reticle 20 is positioned by the reticle stage 30. An exposure process is performed in this state. FIG. 10 is a view showing the arrangement of the exposure apparatus 1 in an exposure process.

Although the TTL alignment optical system 100 is moved in this embodiment, it can be prevented from shielding the exposure light by partially moving this optical system or inserting/retracting a mirror into/from the optical path.

In this manner, the exposure apparatus 1 according to this embodiment performs focus detection based on the position information of the image plane side mark 182 of the phase shift type. Hence, the exposure apparatus 1 can simultaneously perform both focus detection and alignment detection in a short period of time because there is no need to scan the wafer stage 60 in the optical axis direction (Z-axis direction) of the projection optical system 40.

Figure 11A:
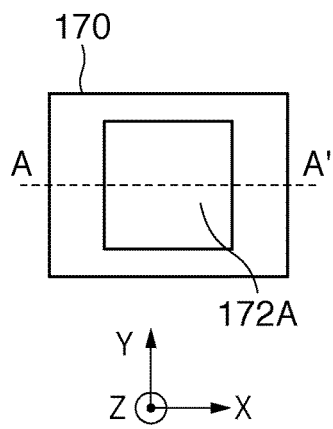
FIGS. 11A and 11B are views illustrating another example of the arrangement of an object plane side mark in the exposure apparatus shown in FIG. 1.
Figure 11B:
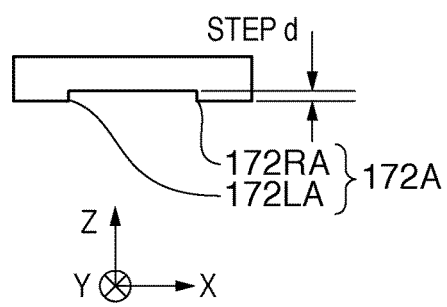

According to a second embodiment of the present invention, the object plane side mark 172 shown in FIGS. 3A and 3B can also be replaced with an object plane side mark 172A shown in FIGS. 11A and 11B. FIGS. 11A and 11B are views showing the arrangement of the object plane side mark 172A. FIG. 11A is a top view of the object plane side mark 172A, and FIG. 11B is a sectional view of the object plane side mark 172A taken along a plane A-A'.

The object plane side mark 172A is formed on a reference plate 170 formed from a transmission substrate (e.g., a glass substrate or a quartz substrate). The object plane side mark 172A is formed by etching the reference plate 170, and has a quadrangular step structure in this embodiment. In this manner, the object plane side mark 172A has a step structure formed from a so-called phase shift type mark without using a light-shielding film. Reference numerals 172LA and 172RA respectively denote the left and right edge portions of the step structure which forms the object plane side mark 172A.

The overall size of the object plane side mark 172A is determined in accordance with the reduction magnification of a projection optical system 40. In this embodiment, since the projection optical system 40 has a reduction magnification of 1/4, the overall size of the object plane side mark 172A is reduced to 1/4 so that the reduced object plane side mark 172A has an overall size about twice that of an image plane side mark 182.

Let λ be the wavelength of the light beam from an optical fiber 62 (a light beam which illuminates the object plane side mark 172A), n be the refractive index of the reference plate 170 (transmission substrate), and m be a natural number.

Then, a step d of the step structure which forms the object plane side mark 172A satisfies equation (1).

Figure 12A:
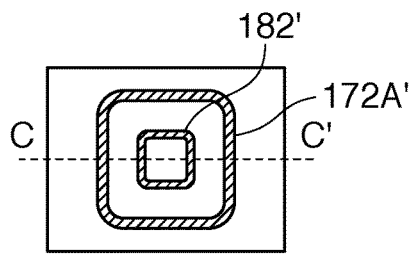
FIGS. 12A and 12B are views showing an object plane side mark image and image plane side mark image obtained by capturing the object plane side mark shown in FIGS. 11A and 11B and the image plane side mark shown in FIGS. 4A and 4B by an image sensor of a TTL alignment optical system.
Figure 12B:
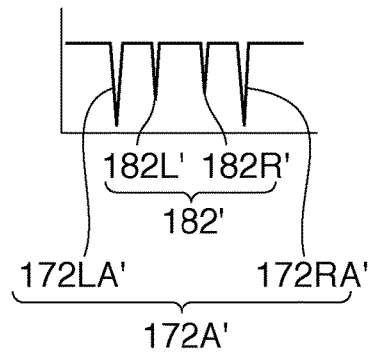

FIGS. 12A and 12B show an object plane side mark image 172A' and image plane side mark image 182' obtained by capturing the object plane side mark 172A shown in FIGS. 11A and 11B and the image plane side mark 182 shown in FIGS. 4A and 4B by an image sensor 107 of a TTL alignment optical system 100. FIG. 12A is a top view of the object plane side mark image 172A' and image plane side mark image 182' captured by the image sensor 107. FIG. 12B is a graph showing the light intensity distribution of the object plane side mark image 172A' and image plane side mark image 182' in a plane C-C'.

The TTL alignment optical system 100 (image sensor 107) simultaneously captures both the object plane side mark image 172A' and image plane side mark image 182'. Note that the image plane side mark image 182' is positioned on the inner side of the object plane side mark image 172A'. A light beam which forms the object plane side mark image 172A' (edge images 172LA' and 172RA') has an intensity decreased due to factors associated with the edge portions 172LA and 172RA of the step structure which forms the object plane side mark 172A, as in the image plane side mark image 182'. Note that a decrease in light intensity due to factors associated with the edge portions 172LA and 172RA of the step structure is accounted for by the influence of their light scattering and interference between the upper surface/lower surface at the edge portions.

Focus detection and alignment detection in this embodiment will be explained in detail with reference to FIGS. 13A and 13B. FIGS. 13A and 13B are graphs showing the light intensity distributions (equivalent to that shown in FIG. 12B) of the object plane side mark image 172A' and image plane side mark image 182' captured by the image sensor 107 of the TTL alignment optical system 100.

Alignment detection will be explained first. In FIG. 12A, a position Xr of the object plane side mark image 172A' on the image sensor 107 is detected as the middle position between the edge images 172LA' and 172RA'. Also, a position Xw of the image plane side mark image 182' on the image sensor 107 is detected as the middle position between edge images 182L' and 182R', as described above.

From the foregoing, an amount of positional shift ΔX of the image plane side mark 182 relative to the object plane side mark 172A is given by equation (2).

Focus detection will be explained next. The amount of defocus of the object plane side mark 172A can be obtained based on a distance (interval) DR between the edge images 172LA' and 172RA', as shown in FIG. 13B. On the other hand, the amount of defocus of the image plane side mark 182 can be obtained based on a distance (interval) D between the edge images 182L' and 182R'.

More specifically, an amount of defocus Fz of the image plane side mark 182 can be calculated by equation (3) mentioned above. The amount of defocus Fz can be calculated in a short period of time by substituting m3, D0, and the interval D between the edge images 182L' and 182R', which are saved in an exposure apparatus 1 as system parameters, into equation (3).

Also, an amount of defocus Frz of the object plane side mark 172A can be calculated by:

$$Frz=(DR-DR0)/m4 \quad (4)$$

Where DR0 is the offset, and m4 is the magnification. m4 is obtained while driving a reticle stage 30 in the optical axis direction (Z-axis direction) of the projection optical system 40 during assembly of the exposure apparatus 1, and is saved in the exposure apparatus 1 as a system parameter. DR0 is saved in the exposure apparatus 1 as a system parameter as well.

In this manner, the amount of defocus Frz can be calculated in a short period of time by substituting m4, DR0, and the interval DR between the edge images 172LA' and 172RA', which are saved in the exposure apparatus 1 as system parameters, into equation (4).

According to a third embodiment of the present invention, the object plane side mark 172 shown in FIGS. 3A and 3B can also be replaced with an object plane side mark 172B shown in FIGS. 14A to 14C, and the image plane side mark 182 shown in FIGS. 4A and 4B can also be replaced with an image plane side mark 182B shown in FIGS. 15A to 15C. FIGS. 14A to 14C are views showing the arrangement of the object plane side mark 172B. FIG. 14A is a top view of the object plane side mark 172B, and FIG. 14B is a sectional view of the object plane side mark 172B taken along a plane A-A'. FIG. 14C is a graph showing the light intensity distribution, in the plane A-A', of a mark image 172Bx' of a mark 172Bx which constitutes the object plane side mark 172B. FIGS. 15A to 15C are views showing the arrangement of the image plane side mark 182B. FIG. 15A is a top view of the image plane side mark 182B, and FIG. 15B is a sectional view of the image plane side mark 182B taken along a plane B-B'. FIG. 15C is a graph showing the light intensity distribution, in the plane B-B', of a mark image 182Bx' of a mark 182Bx which constitutes the image plane side mark 182B.

The object plane side mark 172B is formed on a reference plate 170 formed from a transmission substrate (e.g., a glass substrate or a quartz substrate), as shown in FIG. 14A. The object plane side mark 172B is formed from a light-shielding film made of, for example, chromium or chromium oxide, and has a function of shielding the light beam from an optical fiber 62. In other words, the object plane side mark 172B is made of chromium or chromium oxide having a thickness (about 100 nm) large enough to sufficiently shield (absorb) a light beam. The object plane side mark 172B includes a mark 172Bx including rectangular patterns arrayed in the X-axis direction, and a mark 172By including rectangular patterns arrayed in the Y-axis direction.

The image plane side mark 182B is formed on a reference plate 180 formed from a transmission substrate (e.g., a glass substrate or a quartz substrate), as shown in FIG. 15A. The image plane side mark 182B is formed by etching the reference plate 180. The image plane side mark 182B includes the mark 182Bx including rectangular step structures arrayed in the X-axis direction, and a mark 182By including rectangular step structures arrayed in the Y-axis direction. A step d of the step structures which form the marks 182Bx and 182By satisfies equation (1). In this manner, the image plane side mark 182B has a step structure formed from a so-called phase shift type mark without using a light-shielding film.

Focus detection and alignment detection in this embodiment is further explained in detail next. The marks 172Bx and 182Bx for detecting the positions in the X-axis direction, and the marks 172By and 182By for detecting the positions in the Y-axis direction have 90° rotational symmetry. To avoid a repetitive description, only focus detection and alignment detection using the marks 172Bx and 182Bx will be explained below.

As shown in FIGS. 14B and 14C, a light beam which forms the mark image 172Bx' captured by an image sensor 107 of a TTL alignment optical system 100 has an intensity which decreases in correspondence with the mark 172Bx formed from a light-shielding film. Also, as shown in FIGS. 15B and 15C, a light beam which forms the mark image 182Bx' captured by the image sensor 107 of the TTL alignment optical system 100 has an intensity which decreases in correspondence with the edge portions of the step structure which forms the mark 182Bx.

The position of the mark 172Bx in the X-axis direction can be obtained by calculating a plurality of bottom positions corresponding to the positions of rectangular patterns on the image sensor 107, and averaging the calculation results. Likewise, the position of the mark 182Bx can be obtained by calculating a plurality of bottom positions corresponding to the positions at which the step structure is present, and averaging the calculation results. The amount of positional shift of the image plane side mark 182B relative to the object plane side mark 172B is calculated using equation (2), thereby performing alignment detection.

The amount of defocus of the mark 182Bx can be obtained by calculating the average of intervals D1, D2, and D3 of bottom positions corresponding to pairs of unit step structures, as shown in FIG. 15C, and substituting the calculated average to D in equation (3). In this manner, focus detection can be performed using the TTL alignment optical system 100.

The use of the object plane side mark 172B shown in FIGS. 14A to 14C, and the image plane side mark 182B shown in FIGS. 15A to 15C allows improvements in accuracy of alignment detection and focus detection by exploiting the average effect.

According to a fourth embodiment of the present invention, the object plane side mark 172 shown in FIGS. 3A and 3B can also be replaced with an object plane side mark 172C shown in FIGS. 16A to 16C, and the image plane side mark 182 shown in FIGS. 4A and 4B can also be replaced with an image plane side mark 182C shown in FIGS. 17A to 17C. FIGS. 16A to 16C are views showing the arrangement of the object plane side mark 172C. FIG. 16A is a top view of the object plane side mark 172C, and FIG. 16B is a sectional view of the object plane side mark 172C taken along a plane A-A'. FIG. 16C is a graph showing the light intensity distribution, in the plane A-A', of a mark image 172Cx' of a mark 172Cx which constitutes the object plane side mark 172C. FIGS. 17A to 17C are views showing the arrangement of the image plane side mark 182C. FIG. 17A is a top view of the image plane side mark 182C, and FIG. 17B is a sectional view of the image plane side mark 182C taken along a plane B-B'. FIG. 17C is a graph showing the light intensity distribution, in the plane B-B', of a mark image 182Cx' of a mark 182Cx which constitutes the image plane side mark 182C.

The object plane side mark 172C includes the mark 172Cx and a mark 172Cy, as shown in FIG. 16A. The mark 172Cx includes a light-shielding portion, and a transmission portion in which rectangular patterns that transmit a light beam are arrayed in the X-axis direction. Also, the mark 172Cy includes a light-shielding portion, and a transmission portion in which rectangular patterns that transmit a light beam are arrayed in the Y-axis direction. The light-shielding portion which constitutes the object plane side mark 172C is formed from a chromium film or chromium oxide film having a thickness of about 100 nm.

The image plane side mark 182C includes the mark 182Cx and a mark 182Cy, as shown in FIG. 17A. The mark 182Cx includes a light-shielding portion, and a transmission portion in which rectangular patterns that transmit a light beam are arrayed in the X-axis direction. The transmission portion of the mark 182Cx includes a step structure which is formed by etching a reference plate 180 and has a step d which satisfies equation (1), and a non-etched portion in which the reference plate 180 is not etched. The step structure and the non-edged portion satisfy a relation:

$$W1:W2:W3=1:1:2$$

where W1 is the width of the step structure, W2 is the width of the non-etched portion, and W3 is the width of the light-shielding portion in each constitutional unit of the mark 182Cx. Also, the mark 182Cx includes marks 182CxL and 182CxR, which have a structure bilaterally symmetrical about the Y-axis. The mark 182Cy includes a light-shielding portion, and a transmission portion in which rectangular patterns that transmit a light beam are arrayed in the Y-axis direction. The mark 182Cy has the same arrangement as that of the mark 182Cx.

Focus detection and alignment detection in this embodiment will next be explained in further detail. The marks 172Cx and 182Cx for detecting the positions in the X-axis direction, and the marks 172Cy and 182Cy for detecting the positions in the Y-axis direction have 90° rotational symmetry. To avoid a repetitive description, only focus detection and alignment detection using the marks 172Cx and 182Cx will be explained below.

As shown in FIGS. 16B and 16C, a light beam which forms the mark image 172Cx' captured by an image sensor 107 of a TTL alignment optical system 100 has an intensity which increases in correspondence with the transmission portion of the mark 172Cx. Also, as shown in FIGS. 17B and 17C, a light beam which forms the mark image 182Cx' captured by the image sensor 107 of the TTL alignment optical system 100 has an intensity which increases in correspondence with the region in which the light-shielding portion which constitutes the mark 182Cx is absent.

In this embodiment, ±1st-order diffracted light beams from the marks 172Cx and 182Cx have asymmetrical intensities, as has been described in detail in Japanese Patent Laid-Open No. 2002-055435. Therefore, the marks 172Cx and 182Cx generate asymmetrical distributions of diffracted light beams, so their positions shift in opposite directions due to defocusing.

The position of the mark 172Cx can be obtained by calculating a plurality of peak positions corresponding to the positions at which the transmission portion is present on the image sensor 107, and averaging the calculation results. Likewise, the position of the mark 182Cx in the X-axis direction can be obtained by calculating a plurality of peak positions corresponding to the positions at which the transmission portion is present, and averaging the calculation results. The amount of positional shift of the image plane side mark 182C relative to the object plane side mark 172C is calculated using equation (2), thereby performing alignment detection.

The amount of defocus of the mark 182Cx can be obtained as follows. First, peak positions L1, L2, and L3 of the mark 182CxL are obtained, and the average of the obtaining results is calculated. Likewise, peak positions R1, R2, and R3 of the mark 182CxR are obtained, and the average of the obtaining results is calculated. The interval between the average peak positions of the marks 182CxL and 182CxR is obtained, and the obtained interval is substituted into equation (3). The amount of defocus of the mark 182Cx is thus obtained. In this manner, focus detection can be performed using the TTL alignment optical system 100.

Figure 18:
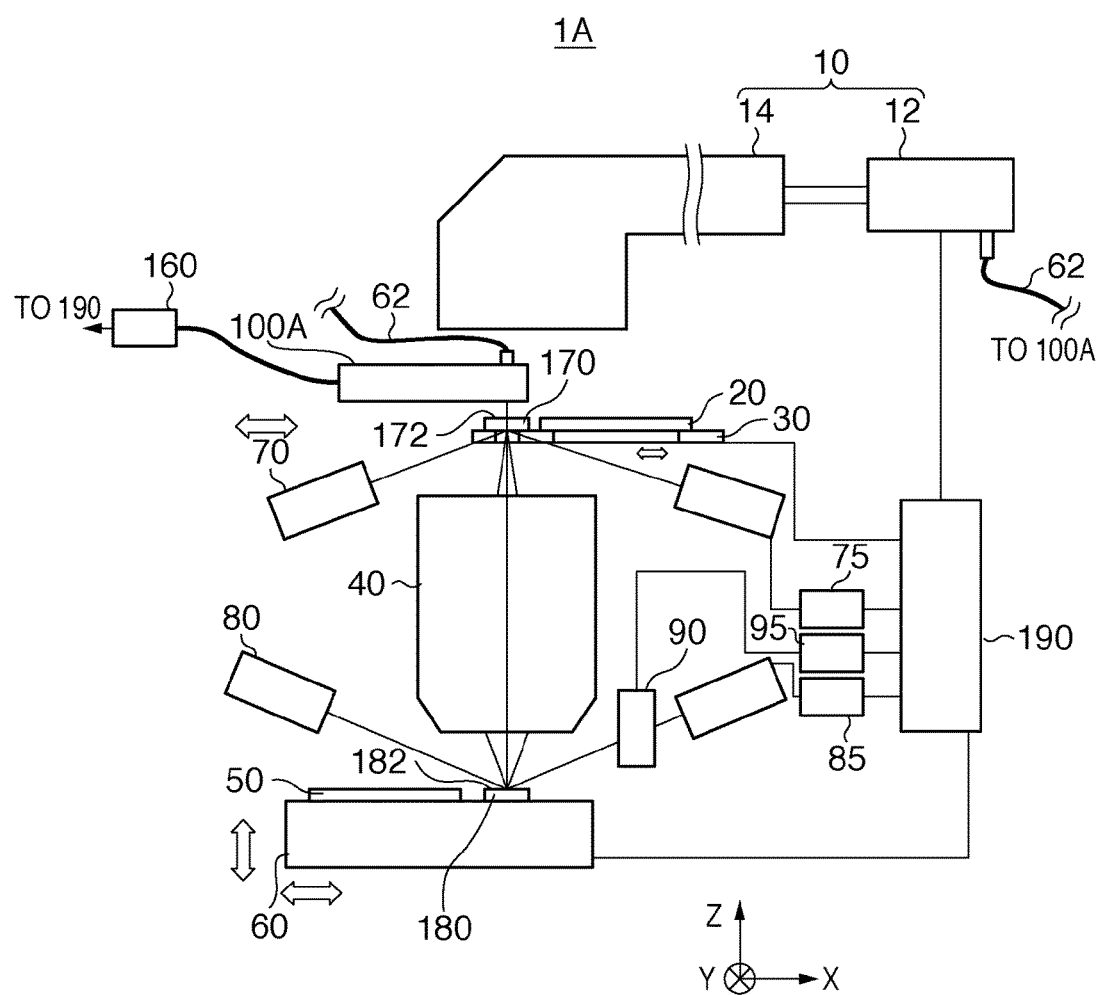
FIG. 18 is a view showing the arrangement of an exposure apparatus according to one aspect of the present invention.

FIG. 18 is a view showing the arrangement of an exposure apparatus 1A according to a fifth embodiment of the present invention. The exposure apparatus 1A has an arrangement similar to that of the exposure apparatus 1, but includes a TTL alignment optical system 100A having an arrangement different from that of the TTL alignment optical system 100. In the exposure apparatus 1A, the TTL alignment optical system 100A serves as an optical system (a so-called double-pass optical system) which guides a light beam from the object plane side and receives the light beam reflected by a wafer 50 or reference plate 180 via a projection optical system 40. Note that a light beam from a light source 12 is partially supplied to the TTL alignment optical system 100A via an optical fiber 62.

Figure 19:
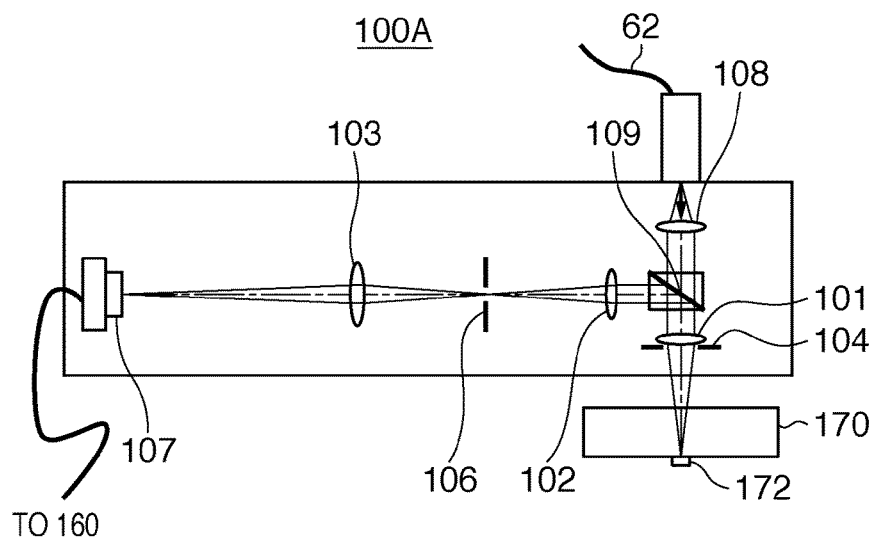
FIG. 19 is a view showing the arrangement of a TTL alignment optical system of the exposure apparatus shown in FIG. 18.

As shown in FIG. 19, the TTL alignment optical system 100A includes imaging lenses 101, 102, and 103, an aperture stop 104, a field stop 106, and an image sensor 107. The TTL alignment optical system 100A also includes a collimator lens 108 and beam splitter 109. In this embodiment, the imaging lenses 101 and 102 have a unit imaging magnification, and the imaging lens 103 has an imaging magnification of 50×. FIG. 19 is a view showing the arrangement of the TTL alignment optical system 100A.

An object plane side mark 172 formed on a reference plate 170 on a reticle stage 30 is imaged on the field stop 106 via the imaging lenses 101 and 102. The object plane side mark 172 imaged on the field stop 106 is imaged again on the image sensor 107 via the imaging lens 103. The image of the object plane side mark 172 captured by the image sensor 107 is sent to a calculation unit 160.

In contrast, an image plane side mark 182 formed on the reference plate 180 on a wafer stage 60 is illuminated with the light beam transmitted through the reference plate 170 on the reticle stage 30 via the projection optical system 40. The light beam reflected by the reference plate 180 enters the projection optical system 40 and forms an image on the image sensor 107 via the reference plate 170 on the reticle stage 30 and the imaging lenses 101 to 103. Consequently, the image plane side mark 182 on the reference plate 180 on the wafer side, and the object plane side mark 172 on the reference plate 170 on the reticle side are imaged on the image sensor 107 of the TTL alignment optical system 100A.

The image plane side mark 182 is formed by etching the reference plate 180 to form a step structure, and forming a light-shielding film made of, for example, chromium or chromium oxide on the reference plate 180. Alternatively, the image plane side mark 182 may be formed on a reference plate 180 formed from a reflective substrate. Thus, the image plane side mark 182 is formed as a reflective mark of the phase shift type.

Let $\lambda$ be the wavelength of the light beam from the optical fiber 62 (a light beam which illuminates the image plane side mark 182), and m be a natural number. Then, a step d of the step structure which forms the image plane side mark 182 satisfies:

$$d=(2m-1)\cdot\lambda/4 \qquad (5)$$

From the foregoing, the phase shift amount (the phase difference between a light beam which passes through a relatively low region and that which passes through a relatively high region in the step structure) of the light beam reflected by the image plane side mark 182 in the step structure (edge portion) is an odd multiple of 90°. Note that equation (5) shows the step d of a most preferable step structure. For this reason, the phase shift amount need not be exactly an odd multiple of 90°, and need only be roughly an odd multiple of 90° with an error of about ±20°.

An object plane side mark image of the object plane side mark 172 and an image plane side mark image of the image plane side mark 182, which are captured by the image sensor 107 of the TTL alignment optical system 100A, are the same (see FIGS. 6A and 6B) as in the first embodiment. Hence, the same processes as in the first embodiment allow alignment detection and focus detection using the TTL alignment optical system 100A.

In this embodiment, alignment detection and focus detection between the reference plate 170 and the reference plate 180 using the TTL alignment optical system 100A are performed by forming the object plane side mark 172 on the reference plate 170. However, alignment detection and focus detection between the reference plate 170 (or a reticle 20 having the object plane side mark 172 formed) and a wafer 50 having the image plane side mark 182 formed can be performed in the same way. In this case, the wafer 50 is a reference wafer which is fabricated by etching silicon (Si) and is not coated with resist.

Figure 20:
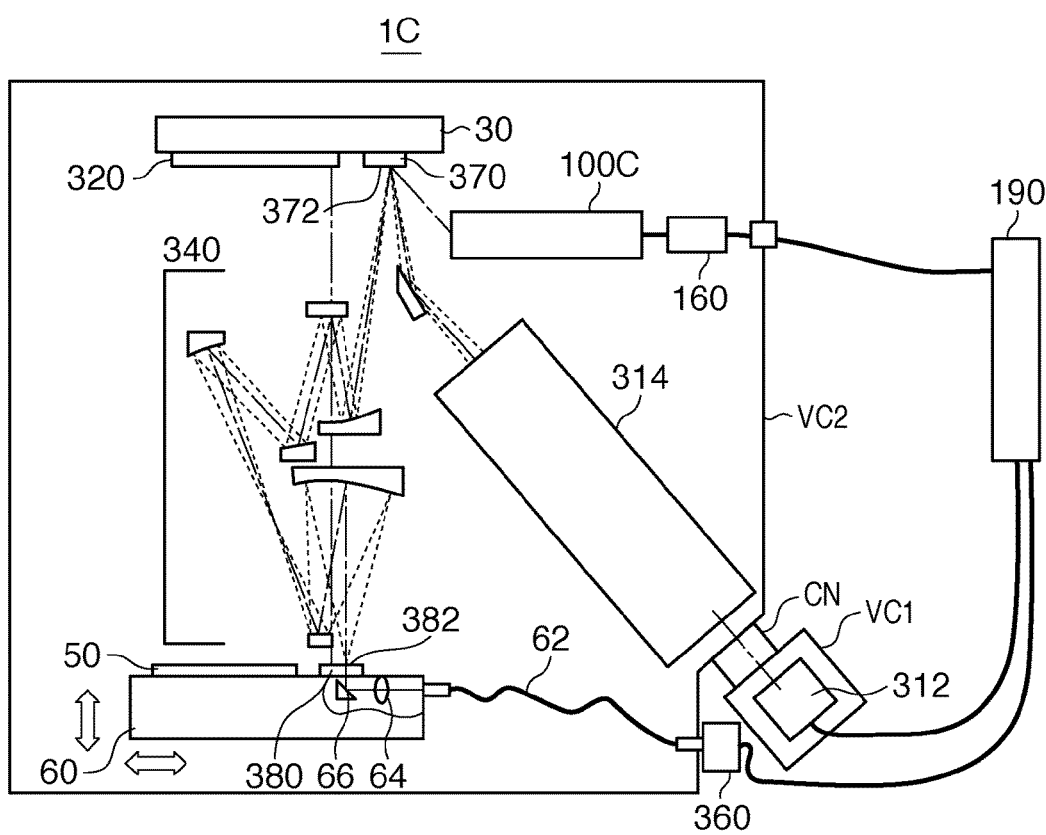
FIG. 20 is a view showing the arrangement of an exposure apparatus according to one aspect of the present invention.

FIG. 20 is a view showing the arrangement of an exposure apparatus 1C according to a sixth embodiment of the present invention. The exposure apparatus 1C is a projection exposure apparatus (scanner) which transfers the pattern of a reticle 320 onto a wafer 50 by the step & scan scheme using EUV light (wavelength: 13.4 nm etc.) as the exposure light. However, the exposure apparatus 1C can adopt the step & repeat scheme or another exposure scheme.

The exposure apparatus 1C includes two vacuum chambers VC1 and VC2, and a connecting portion CN which connects the vacuum chambers VC1 and VC2. The exposure apparatus 1C also includes an EUV light source 312, an illumination optical system 314, a reticle stage 30 which holds the reticle 320 and a reference plate 370, a projection optical system 340, and a wafer stage 60 which holds the wafer 50 and a reference plate 380. The exposure apparatus 1C also includes an alignment light source 360, TTL alignment optical system 100C, calculation unit 160, and main control unit 190.

The interiors of the vacuum chambers VC1 and VC2 and connecting portion CN are maintained in a vacuum in order to prevent EUV light from the EUV light source 312 from attenuating. The vacuum chamber VC1 accommodates the EUV light source 312. The vacuum chamber VC2 accommodates the illumination optical system 314, reticle stage 30, projection optical system 340, wafer stage 60, and TTL alignment optical system 100C. Alternatively, the vacuum chamber VC1 may separately accommodate the illumination optical system 314, projection optical system 340, reticle stage 30, and wafer stage 60 by forming partitions between them. The vacuum chamber VC2 is maintained at a degree of vacuum as high as about $1\times10^{-4}$ Pa in order to prevent the reflectance from decreasing as impurities contaminate the surfaces of multilayer film mirrors. Note that the vacuum chambers VC1 and VC2 are connected to an exhaust device (not shown).

In this embodiment, the EUV light source 312 is a laser plasma light source. However, the EUV light source 312 is not limited to a laser plasma light source, and can adopt any technique known to those skilled in the art. For example, the EUV light source 312 may be, for example, a Z-pinch, plasma focus, or capillary discharge plasma light source.

The illumination optical system 314 guides EUV light from the EUV light source 312 to the reticle 320, and includes, for example, a plurality of multilayer film mirrors, an oblique-incidence mirror (condensing mirror), and an optical integrator. The condensing mirror has a function of converging EUV light which is nearly isotropically radiated by the EUV light source 312. The optical integrator has a function of uniformly illuminating the reticle 320 at a predetermined numerical aperture. The illumination optical system 314 also includes an aperture (angle of view limiting aperture) set at a position conjugate to that of the reticle 320. The aperture serves to limit the illumination region on the reticle 320 to an arcuated shape.

The reticle 320 is a reflective reticle. The reticle 320 has a circuit pattern and is supported and driven by the reticle stage 30. Diffracted light generated by the reticle 320 is reflected by the projection optical system 340 and projected onto the wafer 50.

The projection optical system 340 includes a plurality of multilayer film mirrors, and reduces and projects the pattern of the reticle 320 onto the wafer 50. The smaller the number of a plurality of multilayer film mirrors which constitute the projection optical system 340, the higher the use efficiency of the EUV light, but the more difficult aberration correction becomes at the same time. In view of this trade-off, the projection optical system 340 typically includes about four to six multilayer film mirrors. To attain a wide exposure region by a small number of mirrors, a wide area is transferred by simultaneously scanning the reticle 320 and wafer 50 using only a narrow arcuated region (ring field) spaced apart from the optical axis by a predetermined distance. The numerical aperture (NA) of the projection optical system 340 on the side of the wafer 50 is about 0.2 to 0.5.

The alignment light source 360 is located outside the vacuum chambers VC1 and VC2 and constitutes an illumination system which illuminates an image plane side mark 382 on the reference plate 380. The alignment light source 360 guides a light beam (e.g., a light beam having a wavelength of 150 nm (inclusive) to 370 nm (inclusive)) having a wavelength different from that of EUV light to the wafer stage 60. More specifically, the alignment light source 360 uses the second harmonic (wavelength: 248 nm) of an Ar laser beam, the fourth harmonic (wavelength: 266 nm) of an Nd:YAG laser, a KrF excimer laser beam, or an ArF excimer laser beam. A light beam from the alignment light source 360 illuminates the image plane side mark 382 on the reference plate 380 via the optical fiber 62, a lens 64, and a deflecting mirror 66.

The TTL alignment optical system 100C and calculation unit 160 cooperatively detect the relative positional relationship between an object plane side mark 372 formed on the reference plate 370 and the image plane side mark 382 formed on the reference plate 380. The TTL alignment optical system 100C uses a light beam which comes from the alignment light source 360 in place of EUV light from the EUV light source 312. The light beam used is guided to travel along the same optical path as that for the EUV light at least at one image height in the projection optical system 340.

Figure 21:
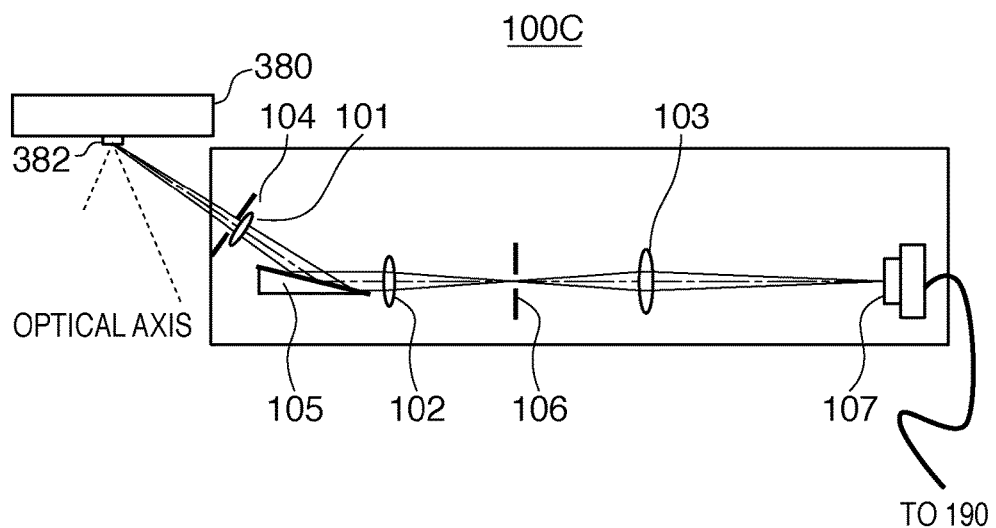
FIG. 21 is a view showing the arrangement of a TTL alignment optical system of the exposure apparatus shown in FIG. 20.

The TTL alignment optical system 100C includes imaging lenses 101, 102, and 103, an aperture stop 104, a reflecting mirror 105, a field stop 106, and an image sensor 107, as shown in FIG. 21. In this embodiment, the imaging lenses 101 and 102 have a unit imaging magnification, and the imaging lens 103 has an imaging magnification of 50×. FIG. 21 is a view showing the arrangement of the TTL alignment optical system 100C.

The object plane side mark 372 for alignment, formed on the reference plate 370 on the reticle stage 30, is imaged on the field stop 106 via the imaging lenses 101 and 102. The object plane side mark 372 imaged on the field stop 106 is imaged again on the image sensor 107 via the imaging lens 103. The image of the object plane side mark 372 captured by the image sensor 107 is sent to the calculation unit 160.

In contrast, the image plane side mark 382 for alignment, formed on the reference plate 380 on the wafer stage 60, is illuminated from below with the light beam emerging from the optical fiber 62. The lens 64 and deflecting mirror 66 are inserted between the optical fiber 62 and the reference plate 380, and the reference plate 380 is illuminated with light having a predetermined illumination shape and angular distribution. The light scattered (diffracted) by the image plane side mark 382 forms an image at the position of the reference plate 370 on the reticle stage 30 via the projection optical system 340 while being enlarged at a magnification of 4×. Consequently, the image plane side mark 382 on the reference plate 380 on the wafer side, and the object plane side mark 372 on the reference plate 370 on the reticle side are imaged on the image sensor 107 of the TTL alignment optical system 100C.

The object plane side mark 372 and image plane side mark 382 will be explained in detail herein.

Figures 22A, 22B:
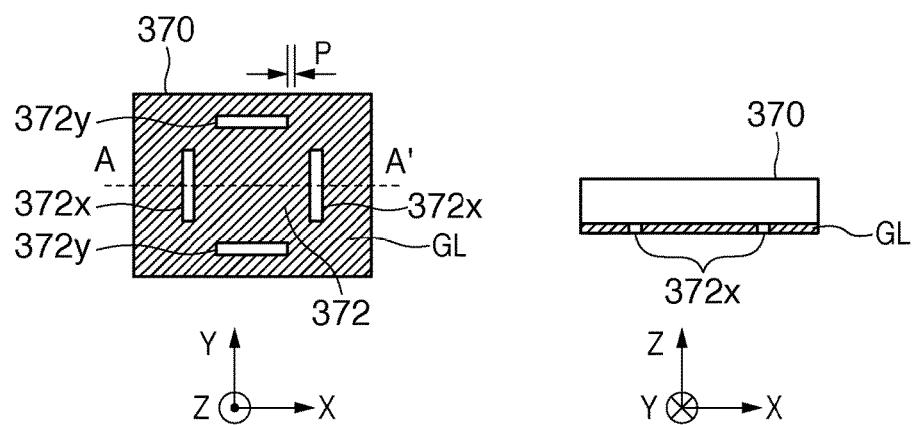
FIGS. 22A and 22B are views illustrating an example of the arrangement of an object plane side mark in the exposure apparatus shown in FIG. 20.

FIGS. 22A and 22B are views illustrating an example of the arrangement of the object plane side mark 372. FIG. 22A is a top view of the object plane side mark 372, and FIG. 22B is a sectional view of the object plane side mark 372 taken along a plane A-A'. The object plane side mark 372 is formed on the reference plate 370 formed from a transmission substrate (e.g., a glass substrate or a quartz substrate). The object plane side mark 372 includes a grid pattern (diffraction grating) GL, a mark 372$x$ including two rectangular patterns, and a mark 372$y$ obtained by rotating the mark 372$x$ through 90°. The grid pattern GL is made of chromium or chromium oxide, and has a function of deflecting the light beam from the optical fiber 62. Note that the marks 372$x$ and 372$y$ do not generate diffracted light beams because the grid pattern GL is absent in the marks 372$x$ and 372$y$.

The overall size of the object plane side mark 372 is determined in accordance with the reduction magnification of the projection optical system 340. In this embodiment, since the projection optical system 340 has a reduction magnification of ¼, the overall size of the object plane side mark 372 is reduced to ¼ so that the reduced object plane side mark 372 has an overall size about twice that of the image plane side mark 382.

Figure 23A:
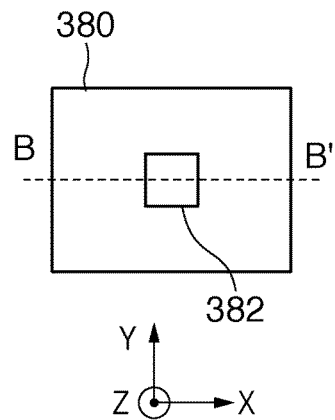
FIGS. 23A and 23B are views illustrating an example of the arrangement of an image plane side mark in the exposure apparatus shown in FIG. 20.
Figure 23B:
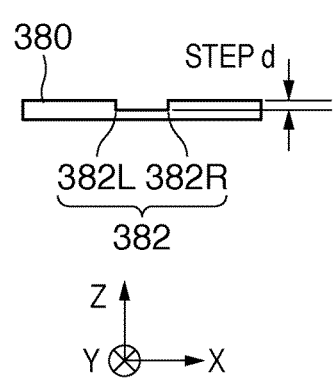

FIGS. 23A and 23B are views illustrating an example of the arrangement of the image plane side mark 382. FIG. 23A is a top view of the image plane side mark 382, and FIG. 23B is a sectional view of the image plane side mark 382 taken along a plane B-B'. The image plane side mark 382 is formed on the reference plate 380 formed from a transmission substrate (e.g., a glass substrate or a quartz substrate). The image plane side mark 382 is formed by etching the reference plate 380, and has a quadrangular step structure in this embodiment. In this manner, the image plane side mark 382 has a step structure formed from a so-called phase shift type mark without using a light-shielding film. A step d of the step structure which forms the image plane side mark 382 satisfies equation (1). Reference numerals 382L and 382R respectively denote the left and right (a pair of) edge portions of the step structure.

The grid pattern GL in the object plane side mark 372 will be explained hereinafter. The grid pattern GL has a function of deflecting the light beam from the optical fiber 62 in a direction different from that toward EUV light as the exposure light, and guiding the deflected light beam to a position at which it does not interfere with the optical path of the illumination optical system 314. In this manner, because the light beam from the optical fiber 62 does not interfere with the optical path of the illumination optical system 314, there is no need to drive the TTL alignment optical system 100C at the time of an exposure process.

Figure 24:
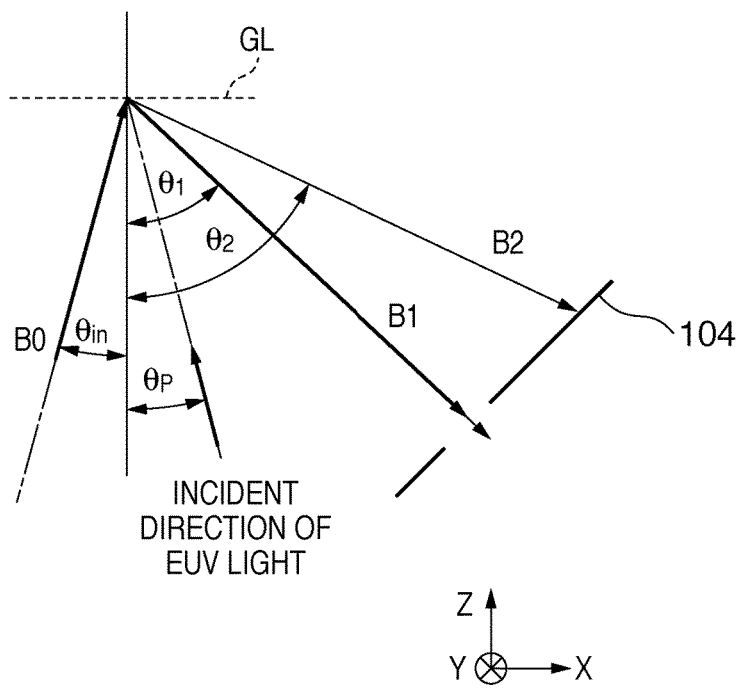
FIG. 24 is a diagram for explaining the relationship between the incident angle and diffraction angle of a light beam which impinges on a grid pattern which forms the object plane side mark shown in FIGS. 22A and 22B.
Figure 26:
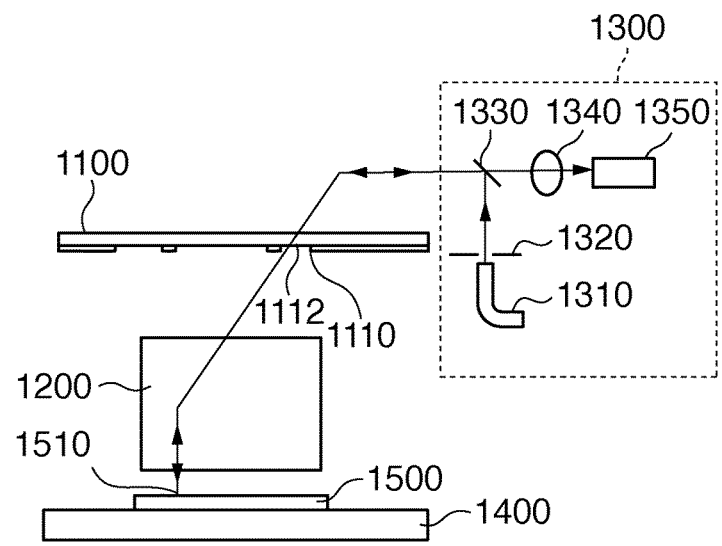
FIG. 26 is a view for explaining alignment detection and focus detection.
Figure 27:
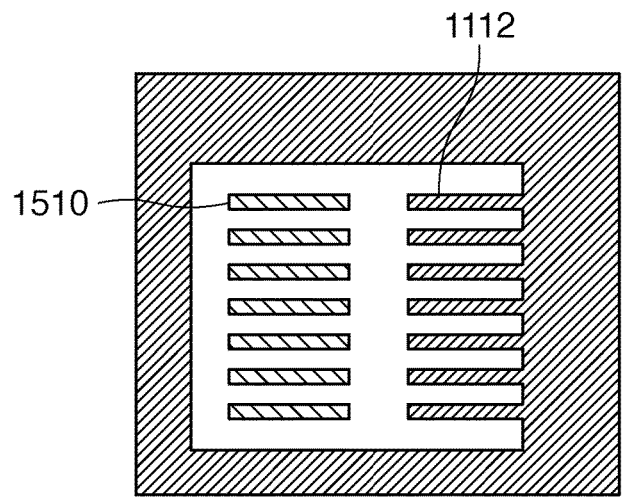
FIG. 27 is a view for explaining alignment detection and focus detection.

The relationship between the incident angle and diffraction angle of a light beam which impinges on the grid pattern GL will be explained with reference to FIG. 24. The grid pattern GL is a one-dimensional diffraction grating having lines arrayed at a pitch P in the X-axis direction. In FIG. 24, let θin be the incident angle of a light beam B0 which impinges on the grid pattern GL, θ1 be the diffraction angle of a 1st-order diffracted light beam B1, and θ2 be the diffraction angle of a 2nd-order diffracted light beam B2. Also, let θp be the angle between the Z-axis and the optical axis of the projection optical system 340. Note that the angle θp is equal to the incident angle at which EUV light as the exposure light strikes the reticle 320.

The incident angle θin of the light beam B0 which impinges on the grid pattern GL and a diffraction angle θm of an mth-order diffracted light beam satisfy a relation:

$$P(\sin θm - \sin θin) = mλ \qquad (6)$$

Where m is the order of diffraction, and λ is the wavelength of a light beam from the alignment light source 360.

For example, assuming that the incident angle θp of EUV light which strikes the reticle 320 is 7°, the incident angle of a light beam which comes from the alignment light source 360 and impinges on the grid pattern GL (reference plate 370) is also 7°. Assume also that the wavelength of a light beam from the alignment light source 360 is 266 nm, the 1st-order diffracted light beam B1 is guided to the TTL alignment optical system 100C, and the diffraction angle of the 1st-order diffracted light beam B1 is 20°. In this case, the pitch P of the grid pattern GL is 1.208 μm. Also, the diffraction angle of the 2nd-order diffracted light beam B2 is 34.2°.

Unwanted diffracted light (e.g., 0th-order diffracted light) from the grid pattern GL has a diffraction angle greatly different from that of 1st-order diffracted light, and therefore does not pass through the aperture stop 104 of the TTL alignment optical system 100C. Consequently, the grid pattern GL is not imaged on the image sensor 107.

In this manner, it is important for the grid pattern GL to guide a light beam from the alignment light source 360 to the TTL alignment optical system 100C while keeping away from the optical axis of the projection optical system 340. The grid pattern GL beneficially has a pitch small enough so that it is not resolved by the image sensor 107. If the grid pattern GL is resolved or a light intensity distribution is generated on the image sensor 107 to a small extent, this produces noise and therefore decreases the accuracies of alignment detection and focus detection.

In this embodiment, the grid pattern GL guides the light beam from the object plane side mark 372 in a direction different from that toward the optical axis of the projection optical system 340. However, a retractable mirror 392 may be located in the optical path of the projection optical system 340, as shown in FIG. 25A. With this arrangement, the light beam from the object plane side mark 372 can be guided to the TTL alignment optical system 100C by inserting the mirror 392 into the optical path of the projection optical system 340. Note that the mirror 392 is retracted to a position at which it does not shield EUV light at the time of an exposure process. Alternatively, a mirror 392 may be located on the reference plate 370, as shown in FIG. 25B. FIGS. 25A and 25B are views for explaining guidance of a light beam from the object plane side mark 372 to the TTL alignment optical system 100C.

Since the projection optical system 340 is formed from multilayer film mirrors, it suffers from no chromatic aberration. For at least this reason, even when the projection optical system 340 receives a light beam having a wavelength other than that of the exposure light (EUV light), the reticle 320 and wafer 50 remain in an imaging relationship. Consequently, the image plane side mark 382 illuminated with a light beam from the alignment light source 360 is imaged on the reference plate 370 on the reticle stage 30 via the projection optical system 340. The image plane side mark 382 imaged on the reference plate 370 is reflected by the reference plate 370 and imaged again on the image sensor 107 of the TTL alignment optical system 100C.

An object plane side mark image of the object plane side mark 372 and an image plane side mark image of the image plane side mark 382, which are captured by the image sensor 107 of the TTL alignment optical system 100C, are the same (see FIGS. 6A and 6B) as in the first embodiment. Hence, the same processes as in the first embodiment allow alignment detection and focus detection using the TTL alignment optical system 100C.

Alignment detection and focus detection between the reference plate 370 and the reference plate 380 using the TTL alignment optical system 100C by forming the object plane side mark 372 including the grid pattern GL on the reference plate 370 have been explained in this embodiment. However, the object plane side mark 372 including the grid pattern GL may be formed on the reticle 320. In this case, the grid pattern GL is preferably formed from an absorber which absorbs EUV light.

The exposure apparatus 1C includes the alignment light source 360 which emits a light beam having a wavelength different from that of EUV light. This makes it possible to form the TTL alignment optical system 100C using, for example, lenses while allowing the use of EUV light as the exposure light. If EUV light is used as the alignment light, the TTL alignment optical system 100C is formed from mirrors, resulting in greater light attenuation in the TTL alignment optical system 100C. In contrast, in this embodiment, the TTL alignment optical system 100C is formed from, for example, lenses using a light beam from the alignment light source 360 as the alignment light. This makes it possible to circumvent the problem of light attenuation in the TTL alignment optical system 100C. Moreover, the TTL alignment optical system 100C does not need to use EUV light which would entail a high running cost, and therefore allows alignment detection at costs comparable to conventional techniques.

The TTL alignment optical system 100C can image the object plane side mark 372 and image plane side mark 382 on the image sensor 107 such as a CCD at an optical magnification of about 50×. Hence, the TTL alignment optical system 100C can perform both alignment detection and focus detection with high accuracies.

Also, in this embodiment, since the projection optical system 340 is a catoptric system, it generates no chromatic aberration. This obviates the need for a chromatic aberration correction optical system necessary in applying a TTL alignment optical system which uses non-exposure light to a dioptric projection optical system.

If a light beam having a wavelength around 13 nm is used, neither focus detection nor alignment detection can be performed with high accuracies. This is for the following reason. The refractive index of the material of a phase shift type mark for a light beam having a wavelength around 13 nm is close to 1. For example, refractive indices (n, k) of $SiO_2$, Mo, and Si are (0.997, 3.15e-5), (0.999, 2.6e-4), and (0.997, 1.6e-5), respectively. To give a phase difference of 90° to a light beam having a wavelength of 13 nm, it is beneficial to form, for example, a step of about 11.2 μm for $SiO_2$ and Si and a step of about 3.4 μm for Mo. At this time, the amounts of absorption in phase shift type marks, calculated from the extinction coefficients k, are 93% for $SiO_2$, 15% for Si, and 56% for Mo. In this manner, the larger the step, the greater the absorption in the phase shift type mark becomes. This changes the shape of the phase shift type mark due to heat generated upon absorption, and, in turn, causes errors in focus detection and alignment detection. To prevent this, an exposure apparatus which uses EUV light as the exposure light needs to use a light beam having a wavelength of 150 nm or more for focus detection and alignment detection instead of using the exposure light. The use of a light beam having a wavelength of about 150 nm or more for focus detection and alignment detection allows selection of an unabsorbent material such as quartz or fluorine-doped quartz. This makes it possible to prevent absorption in the phase shift type mark, and, in turn, prevent a change in its shape.

The wavelength of a light beam emitted by the alignment light source 360 is preferably 150 nm (inclusive) to 370 nm (inclusive), and is more preferably 240 nm (inclusive) to 280 nm (inclusive). This is because a multilayer film mirror has a reflectance of more than 50% for a light beam having a wavelength of 370 nm or less, and, at the same time, there presently exists no glass material which can transmit a light beam having a wavelength shorter than 150 nm. Note that a multilayer film mirror has a reflectance of 65% to 70% or more for a light beam having a wavelength of 240 nm (inclusive) to 280 nm (inclusive), and the efficiency (reflectance) of the projection optical system is maximal in this case.

Also, in this embodiment, since the projection optical system 340 is a reduction system, it is advantageous to locate a phase shift type mark on the image plane side and guide the light beam to the projection optical system 340 from the image plane side from the viewpoint of the magnification of the TTL alignment optical system 100C. For example, a case in which the overall magnification is 200×, and the magnification of the projection optical system 340 is ¼ will be considered. In this case, the magnification necessary for the TTL alignment optical system 100C is 50× when the light beam enters it from the image plane side, and is 800× when the light beam enters it from the object plane side.

Exposure apparatuses 1, 1A, and 1C can simultaneously perform both focus detection and alignment detection in a short period of time, as described above. Hence, the exposure apparatuses 1, 1A, and 1C can provide devices (e.g., a semiconductor device, an LCD device, an image sensing device (e.g., a CCD), and a thin-film magnetic head) with a high throughput and good economical efficiency. In accordance with a seventh embodiment of the present invention, devices are fabricated by a step of exposing a substrate (e.g., a wafer or a glass plate) coated with a photoresist (photosensitive agent) using the exposure apparatuses 1, 1A, and 1C, and a step of developing the exposed substrate. These steps may be repeated. Moreover, the device may be further processed using known steps, such as metallization and packaging.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-265711 filed on Oct. 14, 2008, which is hereby incorporated by reference herein in its entirety.

What is claimed is:

1. An exposure apparatus comprising:
a projection optical system configured to project a pattern of a reticle located on an object plane onto a substrate located on an image plane;
a phase shift type mark mounted on a stage which holds the substrate and having a step structure;
an image sensor which is set at one of a position of the object plane and a position optically conjugate to the object plane, and is configured to capture an image of the phase shift type mark via the projection optical system;
a measurement unit configured to measure an interval between an edge image formed by one side edge portion of the step structure and an edge image formed by another side edge portion of the step structure, in the image of the phase shift type mark captured by the image sensor; and
a controller configured to control a position of the stage in a direction of an optical axis of the projection optical system based on the measured interval.

2. An exposure apparatus comprising:
a projection optical system configured to project a pattern of a reticle located on an object plane onto a substrate located on an image plane;
a phase shift type mark mounted on a stage which holds the substrate and having a step structure;
an image sensor which is set at one of a position of the object plane and a position optically conjugate to the object plane, and is configured to capture an image of the phase shift type mark via the projection optical system; and
a calculation unit configured to calculate a position shift of the phase shift type mark in a direction of an optical axis of the projection optical system from a focus position of the projection optical system based on the interval between an edge image formed by one side edge portion of the step structure and an edge image formed by another side edge portion of the step structure, in the image of the phase shift type mark captured by the image sensor.

3. The exposure apparatus according to claim 2, wherein the calculation unit determines positions, at which a light intensity of the image of the phase shift type mark captured by the image sensor is minimum, as positions of the edge images.

4. The exposure apparatus according to claim 2, further comprising an object plane side mark mounted on a stage which holds the reticle,
wherein the calculation unit calculates positions of the phase shift type mark and the object plane side mark in a direction perpendicular to the optical axis of the projection optical system based on relative position information between the image of the phase shift type mark and an image of the object plane side mark, which are captured by the image sensor.

5. The exposure apparatus according to claim 4, further comprising an imaging optical system which is inserted between the projection optical system and the image sensor, and configured to form the image of the phase shift type mark on the image sensor,
wherein the object plane side mark includes a phase shift type mark, and
the calculation unit calculates a position of the object plane side mark in a direction of an optical axis of the imaging optical system based on an interval between edge images, formed by a pair of edge portions, in the image of the object plane side mark captured by the image sensor.

6. An exposure apparatus comprising:
a projection optical system configured to project a pattern of a reticle located on an object plane onto a substrate located on an image plane;
a phase shift type mark mounted on a stage which holds the substrate; and an image sensor which is set at one of a position of the object plane and a position optically conjugate to the object plane, and is configured to capture an image of the phase shift type mark via the projection optical system, wherein the phase shift type mark includes a first region and a second region, and generates a phase difference of an odd multiple of 90° between a light beam which passes through the first region and a light beam which passes through the second region.

7. An exposure apparatus comprising:

a projection optical system configured to project a pattern of a reticle located on an object plane onto a substrate located on an image plane;

a phase shift type mark mounted on a stage which holds the substrate; and an image sensor which is set at one of a position of the object plane and a position optically conjugate to the object plane, and is configured to capture an image of the phase shift type mark via the projection optical system, wherein the mark has a step structure formed on a transmission substrate, and a step d of the step structure satisfies:

$$d=(2m-1)\cdot\lambda/\{4(n-1)\}$$

where $\lambda$ is a wavelength of a light beam which illuminates the mark, n is a refractive index of the transmission substrate, and m is a natural number.

8. An exposure apparatus comprising:

a projection optical system configured to project a pattern of a reticle located on an object plane onto a substrate located on an image plane;

a phase shift type mark mounted on a stage which holds the substrate; and an image sensor which is set at one of a position of the object plane and a position optically conjugate to the object plane, and is configured to capture an image of the phase shift type mark via the projection optical system, wherein the mark has a step structure formed on a reflective substrate, and a step d of the step structure satisfies:

$$d=(2m-1)\cdot\lambda/4$$

where $\lambda$ is a wavelength of a light beam which illuminates the mark, and m is a natural number.

9. A device fabrication method comprising:

exposing a substrate using an exposure apparatus; and performing a development process for the substrate exposed, wherein the exposure apparatus includes:

a projection optical system configured to project a pattern of a reticle located on an object plane onto the substrate located on an image plane;

a phase shift type mark mounted on a stage which holds the substrate and having a step structure;

an image sensor which is set at one of a position of the object plane and a position optically conjugate to the object plane, and is configured to capture an image of the phase shift type mark via the projection optical system; and a calculation unit configured to calculate a position shift of the phase shift type mark in a direction of an optical axis of the projection optical system from a focus position of the projection optical system based on the interval between an edge image formed by one side edge portion of the step structure and an edge image formed by another side edge portion of the step structure, in the image of the phase shift type mark captured by the image sensor.

10. A device fabrication method comprising:

exposing a substrate using an exposure apparatus; and performing a development process for the substrate exposed, wherein the exposure apparatus includes:

a projection optical system configured to project a pattern of a reticle located on an object plane onto the substrate located on an image plane;

a phase shift type mark mounted on a stage which holds the substrate and having a step structure;

an image sensor which is set at one of a position of the object plane and a position optically conjugate to the object plane, and is configured to capture an image of the phase shift type mark via the projection optical system;

a measurement unit configured to measure an interval between an edge image formed by one side edge portion of the step structure and an edge image formed by another side edge portion of the step structure, in the image of the phase shift type mark captured by the image sensor; and a controller configured to control a position of the stage in a direction of an optical axis of the projection optical system based on the measured interval.

* * * * *